US011222891B2

(12) United States Patent
Matsudai et al.

(10) Patent No.: US 11,222,891 B2
(45) Date of Patent: Jan. 11, 2022

(54) SEMICONDUCTOR DEVICE AND SEMICONDUCTOR CIRCUIT

(71) Applicants: Kabushiki Kaisha Toshiba, Minato-ku (JP); Toshiba Electronic Devices & Storage Corporation, Minato-ku (JP)

(72) Inventors: Tomoko Matsudai, Shibuya (JP); Yoko Iwakaji, Meguro (JP)

(73) Assignees: Kabushiki Kaisha Toshiba, Minato-ku (JP); Toshiba Electronic Devices & Storage Corporation, Minato-ku (JP)

( * ) Notice: Subject to any disclaimer, the term of this patent is extended or adjusted under 35 U.S.C. 154(b) by 160 days.

(21) Appl. No.: 16/791,619

(22) Filed: Feb. 14, 2020

(65) Prior Publication Data

US 2021/0091072 A1 Mar. 25, 2021

(30) Foreign Application Priority Data

Sep. 20, 2019 (JP) ............................ JP2019-171101

(51) Int. Cl.

*H01L 27/07* (2006.01)
*H01L 29/739* (2006.01)
*H03K 17/567* (2006.01)

(52) U.S. Cl.

CPC ...... *H01L 27/0761* (2013.01); *H01L 29/7397* (2013.01); *H03K 17/567* (2013.01)

(58) Field of Classification Search

CPC ........................ H01L 27/0761; H01L 29/7397
See application file for complete search history.

(56) References Cited

U.S. PATENT DOCUMENTS

2005/0045960 A1 3/2005 Takahashi
2012/0313164 A1 12/2012 Senoo
2013/0240947 A1 9/2013 Matsudai et al.
2014/0084337 A1 3/2014 Matsudai et al.
2016/0079369 A1 3/2016 Ogura et al.
2016/0351561 A1 12/2016 Senoo
2017/0250269 A1 8/2017 Sumitomo et al.
(Continued)

FOREIGN PATENT DOCUMENTS

JP 2002-170784 A 6/2002
JP 2007-266570 A 10/2007
(Continued)

*Primary Examiner* — Seahvosh Nikmanesh
(74) *Attorney, Agent, or Firm* — Oblon, McClelland, Maier & Neustadt, L.L.P.

(57) ABSTRACT

A semiconductor device of the embodiment includes a semiconductor layer including a first semiconductor region, a second semiconductor region, a third semiconductor region, a fourth semiconductor region, a fifth semiconductor region, a sixth semiconductor region, a first trench, and a second trench, a first gate electrode in the first trench; a second gate electrode in the second trench; a first electrode on a first face side; a second electrode on a second face side; a first electrode pad connected to the first gate electrode; and a second electrode pad connected to the second gate electrode. The semiconductor device includes a first region including the first semiconductor region; a second region including the second semiconductor region; and a third region provided between the first region and the second region, the third region having a density of the second trench higher than that of the first region.

14 Claims, 14 Drawing Sheets

(56) References Cited

U.S. PATENT DOCUMENTS

| | | | | |
|---|---|---|---|---|
| 2018/0190649 | A1* | 7/2018 | Laven | H01L 29/66136 |
| 2018/0308757 | A1 | 10/2018 | Kakimoto | |
| 2019/0019861 | A1 | 1/2019 | Naito | |
| 2019/0067463 | A1 | 2/2019 | Abe et al. | |
| 2019/0148365 | A1 | 5/2019 | Kono | |
| 2019/0287961 | A1 | 9/2019 | Naito | |
| 2019/0296134 | A1 | 9/2019 | Matsudai et al. | |

FOREIGN PATENT DOCUMENTS

| | | | |
|---|---|---|---|
| JP | 2010-109545 | A | 5/2010 |
| JP | 2013-026534 | A | 2/2013 |
| JP | 2013-197122 | A | 9/2013 |
| JP | 2014-103376 | A | 6/2014 |
| JP | 2016-29710 | A | 3/2016 |
| JP | 2016-58636 | A | 4/2016 |
| JP | 2019-21891 | A | 2/2019 |
| JP | 2019-169575 | A | 10/2019 |
| WO | WO 2011/101955 | A1 | 8/2011 |
| WO | WO 2018/092787 | A1 | 5/2018 |

* cited by examiner

SEMICONDUCTOR DEVICE AND SEMICONDUCTOR CIRCUIT

CROSS-REFERENCE TO RELATED APPLICATION

This application is based upon and claims the benefit of priority from Japanese Patent Application No. 2019-171101, filed on Sep. 20, 2019, the entire contents of which are incorporated herein by reference.

FIELD

Embodiments described herein relate generally to a semiconductor device and a semiconductor circuit.

BACKGROUND

An insulated gate bipolar transistor (IGBT) is an example of a power semiconductor device. In the IGBT, for example, a p-type collector region, an n-type drift region, and a p-type base region are provided on the collector electrode. Further, a gate electrode is provided in a trench. The trench penetrates the p-type base region and reaches the n-type drift region. A gate insulating film is interposed between the trench and the gate electrode. Further, an n-type emitter region connected to the emitter electrode is provided in a region adjacent to the trench on the surface of the p-type base region.

In recent years, a reverse-conducting IGBT (RC-IGBT) in which an IGBT and a freewheeling diode are formed on the same semiconductor chip has been widely developed and commercialized. The RC-IGBT is used as a switching element of an inverter circuit, for example. The freewheeling diode has a function of flowing a current in a direction opposite to the on-state current of the IGBT. Forming the IGBT and the freewheeling diode on the same semiconductor chip has many advantages such as reduction of the chip size by sharing the termination region and distribution of heat generation points.

DETAILED DESCRIPTION

Figure 1:
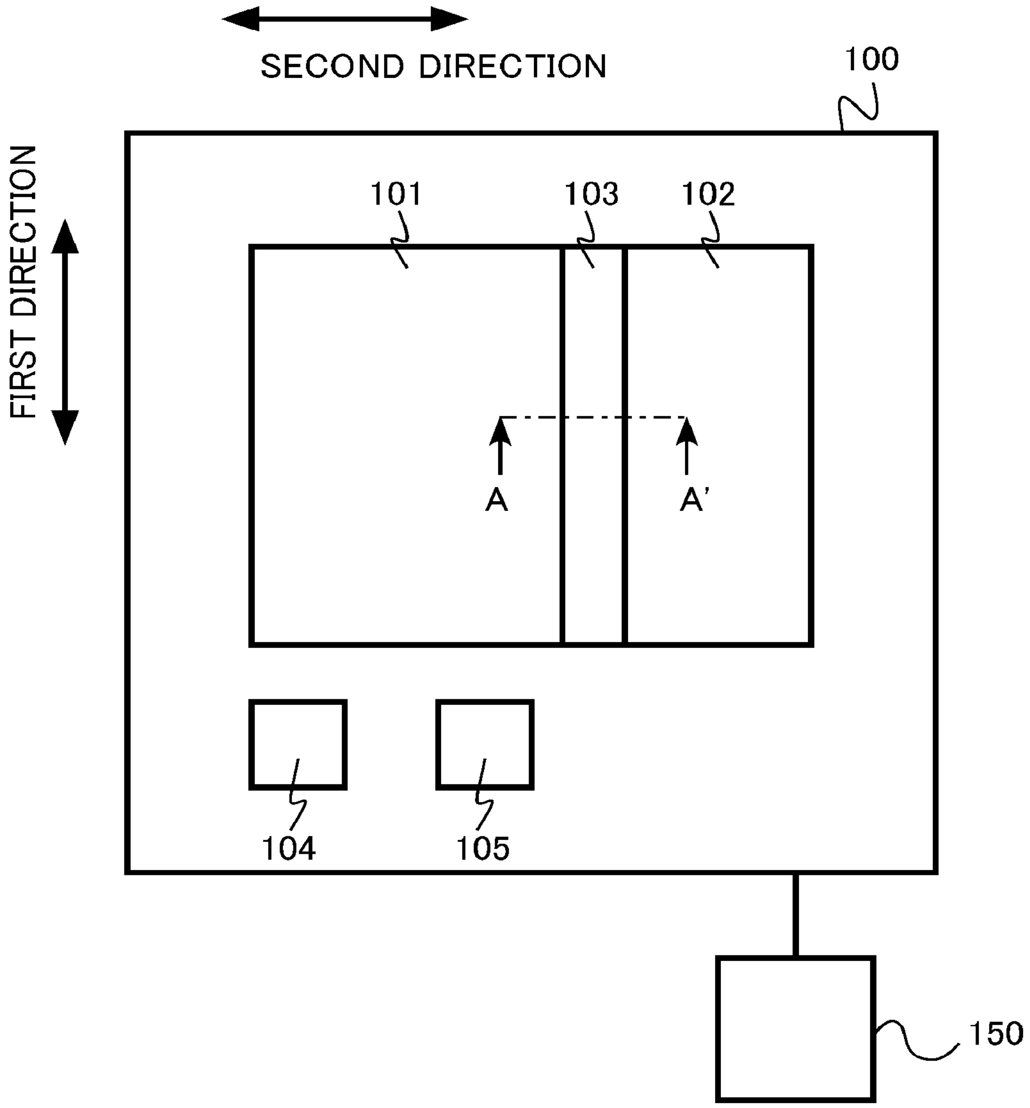
FIG. 1 is a schematic view of a semiconductor circuit according to a first embodiment.

A semiconductor device according to the embodiment includes: a semiconductor layer having a first face and a second face facing the first face, the semiconductor layer including a first semiconductor region of first conductivity type in contact with the second face, a second semiconductor region of second conductivity type in contact with the second face, a third semiconductor region of second conductivity type provided between the first semiconductor region and the first face and between the second semiconductor region and the first face, a fourth semiconductor region of first conductivity type provided between the first semiconductor region and the first face, the fourth semiconductor region interposing the third semiconductor region together with the first semiconductor region, a fifth semiconductor region of second conductivity type provided between the fourth semiconductor region and the first face, a sixth semiconductor region of first conductivity type provided between the second semiconductor region and the first face, the sixth semiconductor region interposing the third semiconductor region together with the second semiconductor region, a first trench provided on the first face side in contact with the fourth semiconductor region, and a second trench provided on the first face side in contact with the fourth semiconductor region; a first gate electrode provided in the first trench; a first gate insulating film provided between the first gate electrode and the third semiconductor region and between the first gate electrode and the fourth semiconductor region, the first gate insulating film being in contact with the fifth semiconductor region; a second gate electrode provided in the second trench; a second gate insulating film provided between the second gate electrode and the third semiconductor region and between the second gate electrode and the fourth semiconductor region; a first electrode provided on the first face side of the semiconductor layer, the first electrode being electrically connected to the fourth semiconductor region, the fifth semiconductor region, and the sixth semiconductor region; a second electrode provided on the second face side of the semiconductor layer, the second electrode being electrically connected to the first semiconductor region and the second semiconductor region; a first electrode pad provided on the first face side of the semiconductor layer, the first electrode pad being electrically connected to the first gate electrode, and the first electrode pad being applied with a first gate voltage; a second electrode pad provided on the first face side of the semiconductor layer, the second electrode pad being electrically connected to the second gate electrode, and the second electrode pad being applied with a second gate voltage; a first region including the first semiconductor region; a second region including the second semiconductor region; and a third region provided between the first region and the second region, the third region having a density of the second trench higher than that of the first region.

Hereinafter, embodiments of the present disclosure will be described with reference to the drawings. Incidentally, in the following description, the same or similar members are denoted by the same reference numerals, and description of members once described is omitted as appropriate.

In this specification, when there is a notation of $n^+$ type, n type, and $n^-$ type, it means that the n type impurity concentration decreases in the order of $n^+$ type, n type, and n− type. In addition, when there is a notation of $p^+$ type, p type, and $p^-$ type, it means that the impurity concentration of p type decreases in the order of $p^+$ type, p type, and $p^-$ type.

In this specification, the distribution and absolute value of the impurity concentration in the semiconductor region can be measured using, for example, secondary ion mass spectrometry (SIMS). In addition, the relative magnitude relationship between the impurity concentrations of two semiconductor regions can be determined using, for example, scanning capacitance microscopy (SCM). In addition, the distribution and absolute value of the impurity concentration can be measured using, for example, a spreading resistance analysis (SRA). In the SCM and the SRA, the relative magnitude relationship and absolute values of the carrier concentrations of the semiconductor regions can be obtained. By assuming the activation rate of impurities, the relative magnitude relationship between the impurity concentrations of two semiconductor regions, the distribution of the impurity concentration, and the absolute value of the impurity concentration can be obtained from the measurement results of the SCM and SRA.

First Embodiment

A semiconductor device according to a first embodiment includes: a semiconductor layer which has a first face and a second face facing the first face, the semiconductor layer including a first semiconductor region of first conductivity type in contact with the second face, a second semiconductor region of second conductivity type in contact with the second face, a third semiconductor region of second conductivity type provided between the first semiconductor region and the first face and between the second semiconductor region and the first face, a fourth semiconductor region of first conductivity type provided between the first semiconductor region and the first face, the fourth semiconductor region interposing the third semiconductor region together with the first semiconductor region, a fifth semiconductor region of second conductivity type provided between the fourth semiconductor region and the first face, a sixth semiconductor region of first conductivity type provided between the second semiconductor region and the first face, the sixth semiconductor region interposing the third semiconductor region together with the second semiconductor region, a first trench provided on the first face side in contact with the fourth semiconductor region, and a second trench provided on the first face side in contact with the fourth semiconductor region; a first gate electrode provided in the first trench; a first gate insulating film provided between the first gate electrode and the third semiconductor region and between the first gate electrode and the fourth semiconductor region, the first gate insulating film being in contact with the fifth semiconductor region; a second gate electrode provided in the second trench; a second gate insulating film provided between the second gate electrode and the third semiconductor region and between the second gate electrode and the fourth semiconductor region; a first electrode provided on the first face side of the semiconductor layer, the first electrode being electrically connected to the fourth semiconductor region, the fifth semiconductor region, and the sixth semiconductor region; a second electrode provided on the second face side of the semiconductor layer, the second electrode being electrically connected to the first semiconductor region and the second semiconductor region; a first electrode pad provided on the first face side of the semiconductor layer, the first electrode pad being electrically connected to the first gate electrode, and the first electrode pad being applied with a first gate voltage; a second electrode pad provided on the first face side of the semiconductor layer, the second electrode pad being electrically connected to the second gate electrode, and the second electrode pad being applied with a second gate voltage; a first region including the first semiconductor region; a second region including the second semiconductor region; and a third region provided between the first region and the second region, the third region having a density of the second trench higher than that of the first region.

The semiconductor circuit according to the first embodiment includes a semiconductor device and a control circuit configured to drive the semiconductor device and change the second gate voltage from a first voltage to a second voltage before changing the first gate voltage from a turn-on voltage to a turn-off voltage such that the second voltage is a negative voltage when the first conductivity type is p-type, and the second voltage is a positive voltage when the first conductivity type is n-type.

The semiconductor device of the first embodiment is an RC-IGBT 100 in which an IGBT and a freewheeling diode are formed on the same semiconductor chip. The RC-IGBT 100 has a trench gate type IGBT having a gate electrode in a trench formed in a semiconductor layer. Hereinafter, an example in which the first conductivity type is p-type and the second conductivity type is n-type will be described.

The control circuit of the first embodiment is a gate driver circuit 150. The semiconductor circuit of the first embodiment includes a semiconductor device and a control circuit that controls the semiconductor device. The semiconductor circuit is, for example, a semiconductor module on which the RC-IGBT 100 and the gate driver circuit 150 are mounted.

Figure 2:
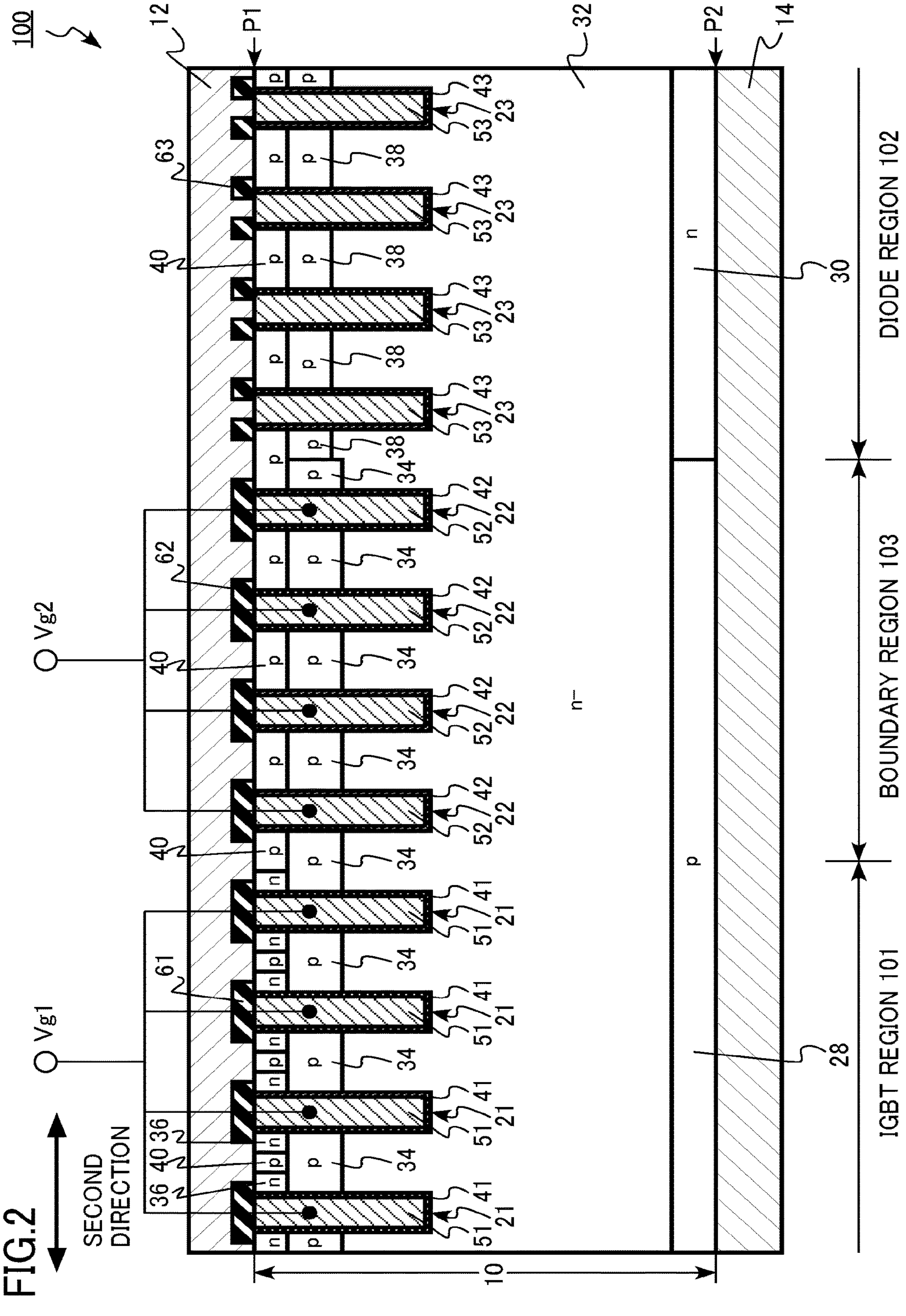
FIG. 2 is a schematic cross-sectional view of a part of the semiconductor device of the first embodiment.
Figure 3:
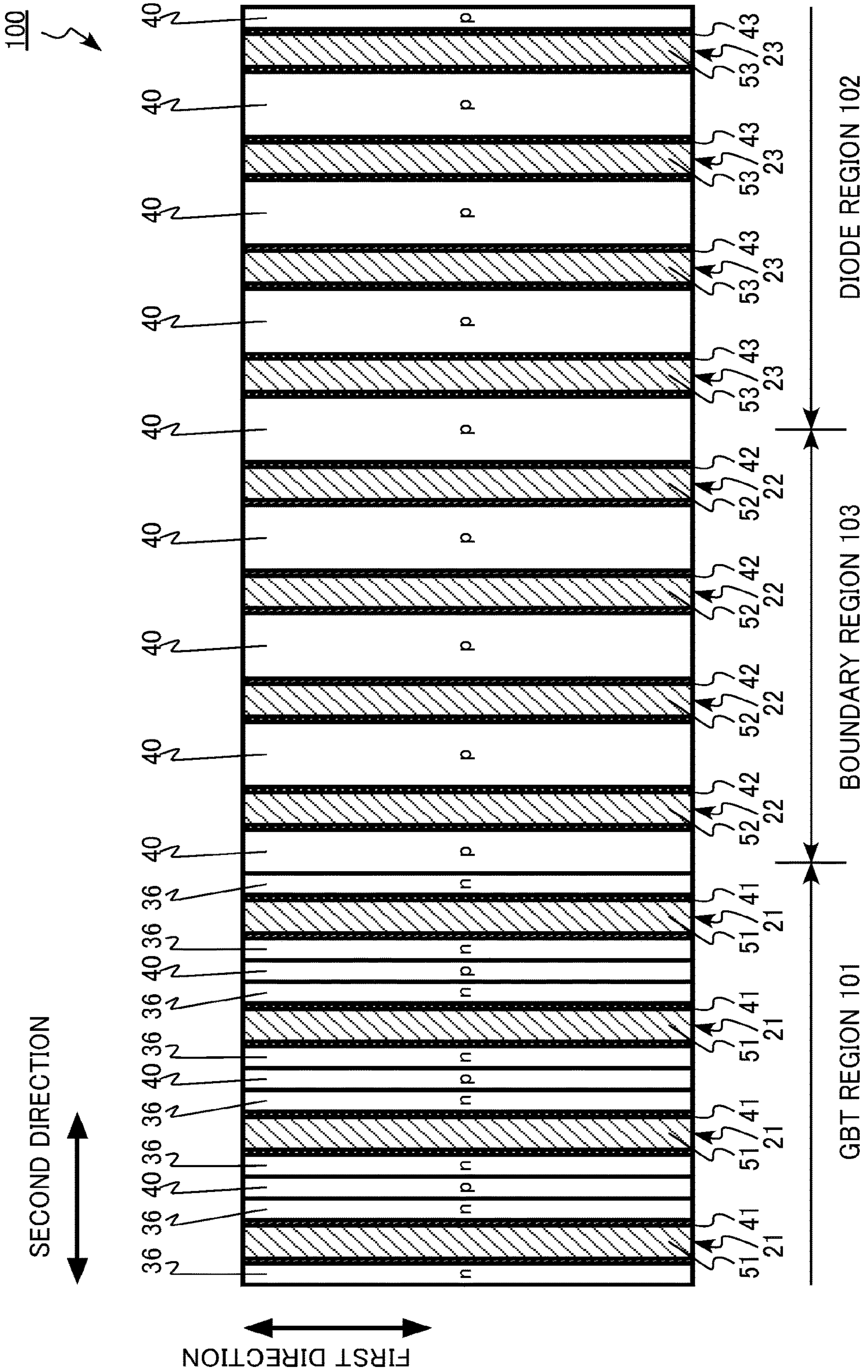
FIG. 3 is a schematic top view of a part of the semiconductor device of the first embodiment.

FIG. 1 is a schematic view of the semiconductor circuit of the first embodiment. FIG. 2 is a schematic cross-sectional view of a part of the semiconductor device of the first embodiment. FIG. 2 is a cross section taken along line A-A' of FIG. 1. FIG. 3 is a schematic top view of a part of the semiconductor device of the first embodiment. FIG. 3 is a top view of a first face P1.

The semiconductor circuit of the first embodiment includes an RC-IGBT 100 and a gate driver circuit 150. The RC-IGBT 100 includes an IGBT region 101 (first region), a diode region 102 (second region), and a boundary region 103 (third region). The boundary region 103 is provided between the IGBT region 101 and the diode region 102.

The IGBT region 101 operates as an IGBT. The diode region 102 operates as a freewheeling diode. The freewheeling diode is, for example, a fast recovery diode (FRD).

The RC-IGBT 100 of the first embodiment includes a semiconductor layer 10, an upper electrode 12 (first electrode), a lower electrode 14 (second electrode), a first gate insulating film 41, a second gate insulating film 42, a first insulating film 43, a first gate electrode 51, a second gate electrode 52, a diode conductive layer 53 (first conductive layer), a first interlayer insulating layer 61, a second interlayer insulating layer 62, a third interlayer insulating layer 63, a first gate electrode pad 104 (first electrode pad), and a second gate electrode pad 105 (second electrode pad).

In the semiconductor layer 10, a first gate trench (first trench), a second gate trench 22 (second trench), a diode trench 23 (third trench), a collector region 28 (first Semiconductor region), a cathode region 30 (second semiconductor region), a drift region 32 (third semiconductor region), a base region 34 (fourth semiconductor region), an emitter region 36 (fifth semiconductor region), an anode region 38 (sixth semiconductor region), and a contact region 40 are provided.

The semiconductor layer 10 has a first face P1 and a second face P2 facing the first face P1. The semiconductor layer 10 is, for example, single crystal silicon. The film thickness of the semiconductor layer 10 is, for example, not less than 40 μm and not more than 700 μm.

In this specification, one direction parallel to the first face P1 is referred to as a first direction. In addition, a direction parallel to the first face P1 and perpendicular to the first direction is referred to as a second direction. In addition, in this specification, "depth" is defined as a distance in a direction toward the second face P2 with respect to the first face P1.

The upper electrode 12 is provided on the first face P1 side of the semiconductor layer 10. At least a part of the upper electrode 12 is in contact with the first face P1 of the semiconductor layer 10.

The upper electrode 12 functions as an IGBT emitter electrode in the IGBT region 101. The upper electrode 12 functions as an anode electrode of the diode in the diode region 102. The upper electrode 12 is, for example, a metal.

The upper electrode 12 is electrically connected to the emitter region 36 in the IGBT region 101. The upper electrode 12 is electrically connected to the base region 34 via the contact region 40 in the IGBT region 101.

The upper electrode 12 is electrically connected to the anode region 38 via the contact region 40 in the diode region 102.

The upper electrode 12 is connected to the base region 34 via the contact region 40 in the boundary region 103.

The lower electrode 14 is provided on the second face P2 side of the semiconductor layer 10. At least a part of the lower electrode 14 is in contact with the second face P2 of the semiconductor layer 10.

The lower electrode 14 functions as an IGBT collector electrode in the IGBT region 101. The lower electrode 14 functions as a cathode electrode of the diode in the diode region 102. The lower electrode 14 is, for example, a metal.

The lower electrode 14 is electrically connected to the collector region 28 in the IGBT region 101.

The lower electrode 14 is electrically connected to the cathode region 30 in the diode region 102.

The lower electrode 14 is electrically connected to the collector region 28 in the boundary region 103.

The collector region 28 is a type semiconductor region. The collector region 28 is in contact with the second face P2. The collector region 28 is electrically connected to the lower electrode 14. The collector region 28 is in contact with the lower electrode 14. The collector region 28 serves as a hole supply source when the IGBT is in an on state.

The cathode region 30 is an $n^+$ type semiconductor region. The cathode region 30 is in contact with the second face P2. The cathode region 30 serves as an electron supply source when the diode is in an on state.

The drift region 32 is an $n^-$ type semiconductor region. The drift region 32 is provided between the collector region 28 and the first face P1 in the IGBT region 101. The drift region 32 is provided between the cathode region 30 and the first face P1 in the diode region 102.

The n-type impurity concentration in the drift region 32 is lower than the n-type impurity concentration in the cathode region 30.

The drift region 32 serves as a path for an on-state current when the IGBT is in an on state. The drift region 32 has a function of being depleted when the IGBT 100 is in an off state and maintaining the breakdown voltage of the IGBT.

The drift region 32 serves as a path for an on-state current when the diode is in an on state. The drift region 32 has a function of being depleted when the diode is in an off state and maintaining the breakdown voltage of the diode.

The base region 34 is a p-type semiconductor region. The base region 34 is provided between the drift region 32 and the first face P1 in the IGBT region 101. In the IGBT region 101, the drift region 32 is sandwiched between the base region 34 and the collector region 28.

The base region 34 is provided between the drift region 32 and the first face P1 in the boundary region 103.

The depth of the base region 34 is, for example, 5 μm or less. In the region of the base region 34 facing the first gate electrode 51, an n-type inversion layer is formed when the IGBT is in an on state. The base region 34 functions as a channel region of a transistor.

The emitter region 36 is an type semiconductor region. In the IGBT region 101, the emitter region 36 is provided between the base region 34 and the first face P1. The emitter region 36 extends on the first face P1 in the first direction.

The emitter region 36 is in contact with the first gate insulating film 41 in the IGBT region 101.

The emitter region 36 is not provided in the boundary region 103. The emitter region 36 is separated from the second gate insulating film 42. The emitter region 36 is not in contact with the second gate insulating film 42.

The emitter region 36 is not provided in the diode region 102. The emitter region 36 is separated from the first insulating film 43. The emitter region 36 is not in contact with the first insulating film 43.

The n-type impurity concentration of the emitter region 36 is higher than the n-type impurity concentration of the drift region 32.

The emitter region 36 is electrically connected to the upper electrode 12. The emitter region 36 is in contact with the upper electrode 12. The emitter region 36 serves as an electron supply source when the transistor having the first gate electrode 51 is in an on state.

The anode region 38 is a p-type semiconductor region. The anode region 38 is provided between the drift region 32 and the first face P1 in the diode region 102. In the diode region 102, the drift region 32 is sandwiched between the anode region 38 and the cathode region 30.

The anode region 38 serves as a hole supply source when the diode is in an on state.

For example, the p-type impurity concentration of the anode region 38 is lower than the p-type impurity concentration of the base region 34. For example, the p-type impurity concentration of the anode region 38 may be the same as or higher than the p-type impurity concentration of the base region 34.

For example, the depth of the anode region 38 is shallower than the depth of the base region 34. For example, the depth of the anode region 38 may be the same as or deeper than the depth of the base region 34.

The contact region 40 is a type semiconductor region. The contact region 40 is provided between the base region 34 and the first face P1 in the IGBT region 101 and the boundary region 103.

The contact region 40 is provided between the anode region 38 and the first face P1 in the diode region 102.

The contact region 40 extends in the first direction on the first face P1. The contact region 40 is electrically connected to the upper electrode 12.

The p-type impurity concentration of the contact region 40 is higher than the p-type impurity concentration of the base region 34 and the p-type impurity concentration of the anode region 38.

The first gate trench 21 is provided in the IGBT region 101. The first gate trench 21 is provided on the first face P1 side of the semiconductor layer 10 in contact with the base region 34.

The first gate trench 21 is a groove provided in the semiconductor layer 10. The first gate trench 21 is a part of the semiconductor layer 10.

As illustrated in FIG. 3, the first gate trench 21 extends on the first face P1 in the first direction parallel to the first face P1. The first gate trench 21 has a stripe shape. The plurality of first gate trenches 21 are repeatedly disposed in the second direction orthogonal to the first direction.

The first gate trench 21 penetrates the base region 34 and reaches the drift region 32. For example, the depth of the first gate trench 21 is 8 μm or less.

The first gate electrode 51 is provided in the first gate trench 21. For example, the first gate electrode 51 is a semiconductor or a metal. For example, the first gate electrode 51 is amorphous silicon or polycrystalline silicon containing n-type impurities or p-type impurities. The first gate electrode 51 is electrically connected to the first gate electrode pad 104.

The first gate insulating film 41 is provided between the first gate electrode 51 and the semiconductor layer 10. The first gate insulating film 41 is formed between the first gate electrode 51 and the drift region 32, between the first gate electrode 51 and the base region 34, and between the first gate electrode 51 and the emitter region 36. The first gate insulating film 41 is in contact with the drift region 32, the base region 34, and the emitter region 36. For example, the first gate insulating film 41 is silicon oxide.

The second gate trench 22 is provided in the boundary region 103. The second gate trench 22 is provided on the first face P1 side of the semiconductor layer 10 in contact with the base region 34.

The second gate trench 22 is a groove provided in the semiconductor layer 10. The second gate trench 22 is a part of the semiconductor layer 10.

As illustrated in FIG. 3, the second gate trench 22 extends on the first face P1 in a first direction parallel to the first face P1. The second gate trench 22 has a stripe shape. The second gate trenches 22 are repeatedly disposed in the second direction orthogonal to the first direction.

The second gate trench 22 penetrates the base region 34 and reaches the drift region 32. For example, the depth of the second gate trench 22 is 8 μm or less.

The second gate electrode 52 is provided in the second gate trench 22. For example, the second gate electrode 52 is a semiconductor or a metal. For example, the second gate electrode 52 is amorphous silicon or polycrystalline silicon containing n-type impurities or p-type impurities. The second gate electrode 52 is electrically connected to the second gate electrode pad 105.

The second gate insulating film 42 is provided between the second gate electrode 52 and the semiconductor layer 10. The second gate insulating film 42 is formed between the second gate electrode 52 and the drift region 32, between the second gate electrode 52 and the base region 34, and between the second gate electrode 52 and the contact region 40. The second gate insulating film 42 is in contact with the drift region 32 and the base region 34. The second gate insulating film 42 is not in contact with the emitter region 36. The second gate insulating film 42 is separated from the emitter region 36. For example, the second gate insulating film 42 is silicon oxide.

The density of the second gate trench 22 in the boundary region 103 is higher than the density of the second gate trench 22 in the IGBT region 101. In the RC-IGBT 100, the second gate trench 22 is not provided in the IGBT region 101, and thus, the density of the second gate trench 22 in the boundary region 103 is higher than the density of the second gate trench 22 in the IGBT region 101.

For example, the density of the second gate trench 22 is a ratio of the second gate trench 22 occupying within a predetermined area of the first face P1.

The diode trench 23 is provided in the diode region 102. The diode trench 23 is provided on the first face P1 side of the semiconductor layer 10 in contact with the anode region 38.

The diode trench 23 is a groove provided in the semiconductor layer 10. The diode trench 23 is a part of the semiconductor layer 10.

As illustrated in FIG. 3, the diode trench 23 extends on the first face P1 in the first direction parallel to the first face P1. The diode trench 23 has a stripe shape. The diode trenches 23 are repeatedly disposed in the second direction orthogonal to the first direction.

The diode trench 23 penetrates the anode region 38 and reaches the drift region 32. For example, the depth of the diode trench 23 is 8 μm or less.

The diode conductive layer 53 is provided in the diode trench 23. For example, the diode conductive layer 53 is a semiconductor or a metal. For example, the diode conductive layer 53 is amorphous silicon or polycrystalline silicon containing n-type impurities or p-type impurities. The diode conductive layer 53 is electrically connected to the upper electrode 12.

The first insulating film 43 is provided between the diode conductive layer 53 and the semiconductor layer 10. The first insulating film 43 is provided between the diode conductive layer 53 and the drift region 32, between the diode conductive layer 53 and the anode region 38, and between the diode conductive layer 53 and the contact region 40. The first insulating film 43 is in contact with the drift region 32 and the anode region 38. The first insulating film 43 is not in contact the emitter region 36. The first insulating film 43 is separated from the emitter region 36. For example, the first insulating film 43 is silicon oxide.

The first interlayer insulating layer 61 is provided between the first gate electrode 51 and the upper electrode 12. The first interlayer insulating layer 61 electrically isolates the first gate electrode 51 and the upper electrode 12 from each other. For example, the first interlayer insulating layer 61 is silicon oxide.

The second interlayer insulating layer 62 is provided between the second gate electrode 52 and the upper electrode 12. The second interlayer insulating layer 62 electrically isolates the second gate electrode 52 and the upper electrode 12 from each other. For example, the second interlayer insulating layer 62 is silicon oxide.

The third interlayer insulating layer 63 is provided between the diode conductive layer 53 and the upper electrode 12. An opening is provided in part of the third interlayer insulating layer 63. The upper electrode 12 is in contact with the diode conductive layer 53 through the opening. The diode conductive layer 53 and the upper electrode 12 are electrically connected. For example, the third interlayer insulating layer 63 is silicon oxide.

Incidentally, the diode conductive layer 53 may be in a floating state in which the diode conductive layer 53 is not fixed to a specific potential. In this case, the third interlayer insulating layer 63 is not provided with an opening.

The first gate electrode pad 104 is provided on the first face P1 side of the semiconductor layer 10. The first gate electrode pad 104 is electrically connected to the first gate electrode 51. For example, the first gate electrode pad 104 and the first gate electrode 51 are connected by a metal wiring (not illustrated). A first gate voltage (Vg1) is applied to the first gate electrode pad 104.

The second gate electrode pad 105 is provided on the first face P1 side of the semiconductor layer 10. Second gate electrode pad 105 is electrically connected to second gate electrode 52. For example, the second gate electrode pad 105 and the second gate electrode 52 are connected by a metal wiring (not illustrated). A second gate voltage (Vg2) is applied to the second gate electrode pad 105.

For example, the gate driver circuit 150 is provided on the same circuit board as the RC-IGBT 100 or on a different circuit board. The gate driver circuit 150 has a function of driving the RC-IGBT 100.

The gate driver circuit 150 has a function of applying a desired first gate voltage (Vg1) and a desired second gate voltage (Vg2) to the first gate electrode pad 104 and the second gate electrode pad 105 at a desired timing.

The gate driver circuit 150 has a function of changing the second gate voltage (Vg2) from the first voltage to the second voltage before changing the first gate voltage (Vg1) from the turn-on voltage to the turn-off voltage. The second voltage is a negative voltage.

Next, a driving method of the RC-IGBT 100, particularly, a method of driving the IGBT in the IGBT region 101 will be described.

Figure 4:
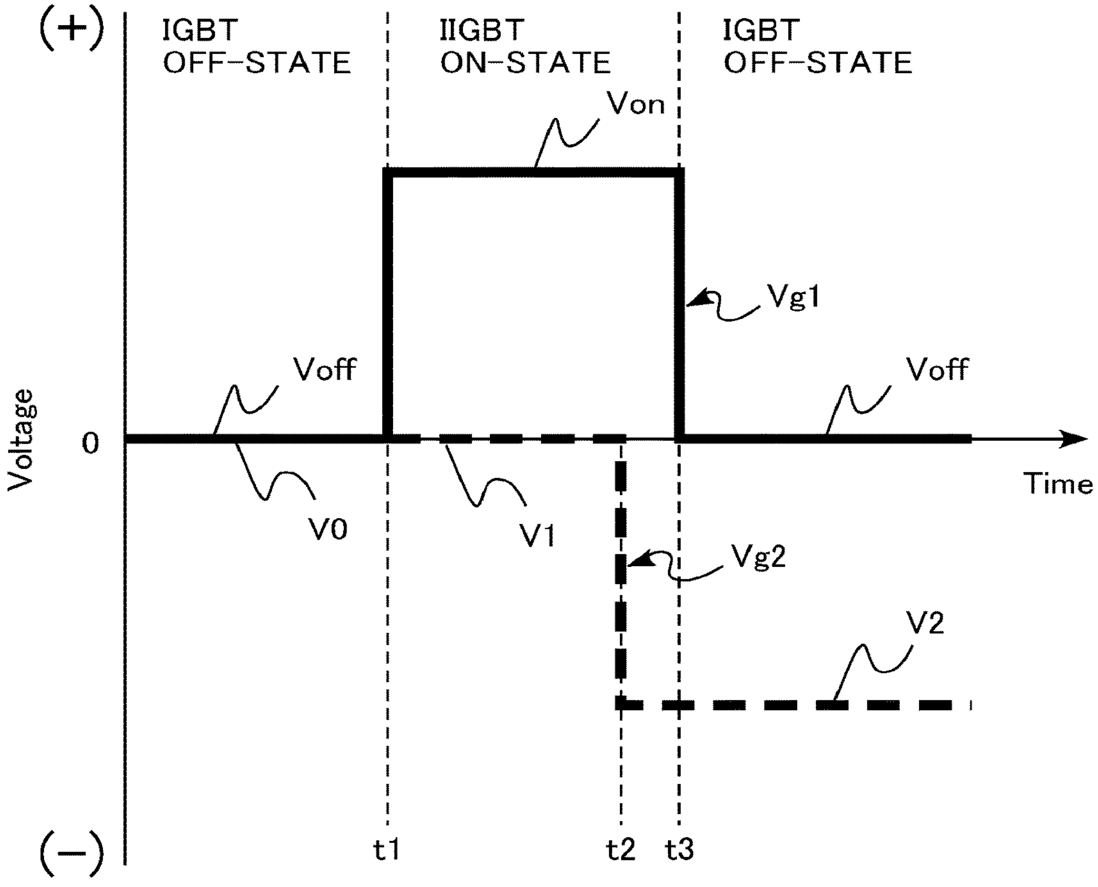
FIG. 4 is an explanatory diagram of a method for driving the semiconductor device of the first embodiment.

FIG. 4 is an explanatory diagram of a method for driving the semiconductor device of the first embodiment. FIG. 4 is a timing chart of the first gate voltage (Vg1) applied to the first gate electrode pad 104 and the second gate voltage (Vg2) applied to the second gate electrode pad 105.

Hereinafter, for convenience of description of operation, a transistor having the first gate electrode 51 is described.

In the off state of the IGBT, for example, an emitter voltage is applied to the upper electrode 12. For example, the emitter voltage is 0V. A collector voltage is applied to the lower electrode 14. For example, the collector voltage is 200V or more and 6500V or less.

In the off state of the IGBT, a turn-off voltage (Voff) is applied to the first gate electrode pad 104. The first gate voltage (Vg1) becomes the turn-off voltage (Voff). Therefore, the turn-off voltage (Voff) is also applied to the first gate electrode 51.

The turn-off voltage (Voff) is a voltage lower than a threshold voltage at which the transistor having the first gate electrode 51 is not turned on, and is 0V or a negative voltage, for example.

In the off state, the n-type inversion layer is not formed in the base region 34 which faces the first gate electrode 51 and is in contact with the first gate insulating film 41.

In the off state of the IGBT, the initial voltage (V0) is applied to the second gate electrode pad 105. For example, the initial voltage (V0) is a voltage at which the p-type inversion layer is not formed in the drift region 32 which faces the second gate electrode 52 and is in contact with the second gate insulating film 42. For example, the initial voltage (V0) is 0V or a positive voltage.

When the IGBT is turned on (time t1 in FIG. 4), a turn-on voltage (Von) is applied to the first gate electrode pad 104. The first gate voltage (Vg1) becomes the turn-on voltage (Von). The turn-on voltage (Von) is also applied to the first gate electrode 51.

The turn-on voltage (Von) is a positive voltage that exceeds the threshold voltage of the transistor having the first gate electrode 51. For example, the turn-on voltage (Von) is 15V. When the turn-on voltage (Von) is applied to the first gate electrode 51, the transistor including the first gate electrode 51 is turned on.

When the IGBT is on, the first voltage (V1) is applied to the second gate electrode pad 105. The first voltage (V1) is the initial voltage (V0).

When the IGBT is turned off (time t3 in FIG. 4), the turn-off voltage (Voff) is applied to the first gate electrode pad 104. The first gate voltage (Vg1) becomes the turn-off voltage (Voff).

Before the first gate voltage (Vg1) is changed from the turn-on voltage (Von) to the turn-off voltage (Voff), that is, before the time t3, the second gate voltage (Vg2) is changed from the first voltage (V1) to the second voltage (V2). The voltage applied to the second gate electrode pad 105 is changed from the first voltage (V1) to the second voltage (V2) at time t2.

The second voltage (V2) is a negative voltage. For example, the second voltage (V2) is not less than −15V and less than 0V. When the second voltage (V2) is applied to the second gate electrode pad 105, a p-type inversion layer is formed in the drift region 32 in contact with the second gate insulating film 42.

For example, the time between time t2 and time t3 is not less than 0.1 microseconds and not more than 20 microseconds. For example, the time between time t2 and time t3 is one microsecond.

Next, the function and effect of the semiconductor device and the semiconductor circuit of the first embodiment will be described.

Figure 5:
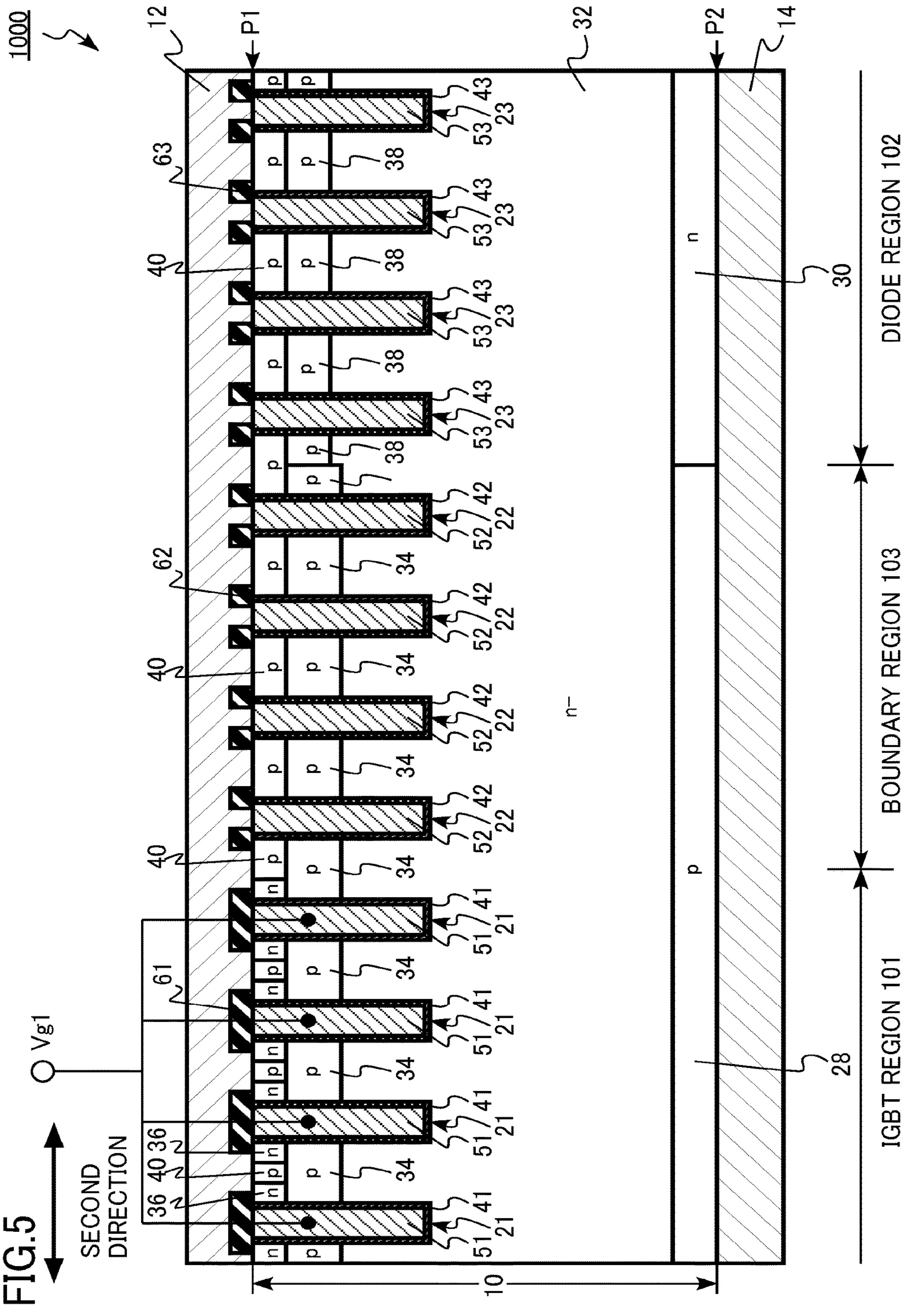
FIG. 5 is a schematic cross-sectional view of a part of a semiconductor device of a comparative example.

FIG. 5 is a schematic cross-sectional view of a part of a semiconductor device of a comparative example. FIG. 5 is a cross section corresponding to FIG. 2.

The semiconductor device of the comparative example is an RC-IGBT 1000 in which the IGBT and the freewheeling diode are formed on the same semiconductor chip. The RC-IGBT 1000 of the comparative example is different from the RC-IGBT 100 of the first embodiment in that the second gate electrode 52 is electrically connected to the upper electrode 12.

In the RC-IGBT 1000, as illustrated in FIG. 5, an opening is provided in a part of the second interlayer insulating layer 62. The upper electrode 12 is in contact with the second gate electrode 52 through the opening. Thereby, the second gate electrode 52 and the upper electrode 12 are electrically connected.

For example, a case is considered in which the RC-IGBT 1000 is used as a switching element of an inverter circuit. When the IGBT of the RC-IGBT 1000 is in an on state, a high voltage is applied to the lower electrode 14 with respect to the upper electrode 12, and a current flows from the lower electrode 14 toward the upper electrode 12.

When the IGBT is in an on state, the turn-on voltage (Von) is applied to the first gate voltage (Vg1).

When the IGBT of the RC-IGBT 1000 is turned off, the first gate voltage (Vg1) is changed from the turn-on voltage (Von) to the turn-off voltage (Voff). When the IGBT is turned off, the current flowing from the lower electrode 14 toward the upper electrode 12 is cut.

For example, when an inductor is provided in the load of the inverter circuit, after the IGBT in the IGBT region 101 is turned off, the diode in the diode region 102 is turned on, and a reflux current flows from the upper electrode 12 toward the lower electrode 14.

At the boundary between the IGBT region 101 and the diode region 102, carriers remain in the drift region 32 after the IGBT is turned off. If the discharge of the remaining carriers is delayed, the presence of the remaining carriers may affect the operation of the diode in the diode region 102, and the operation of the RC-IGBT 1000 may become unstable.

In order to reduce the influence of carriers remaining in the drift region 32, the boundary region 103 in which neither an IGBT nor a diode exists is provided between the IGBT region 101 and the diode region 102. By providing the boundary region 103, the operation of the RC-IGBT 1000 is stabilized. However, the boundary region 103 is an invalid region where neither the IGBT nor the diode operates. Therefore, when the boundary region 103 becomes large, there occurs a problem that the chip size of the RC-IGBT 1000 increases.

In the RC-IGBT 100 of the first embodiment, the second gate electrode 52 is connected to the second gate electrode pad 105, so that the second gate voltage (Vg2) can be changed. The second gate voltage (Vg2) can be changed independently of the first gate voltage (Vg1) applied to the first gate electrode 51.

In the RC-IGBT 100 of the first embodiment, when the IGBT is turned off, the second gate voltage (Vg2) is changed from the first voltage (V1) to the second voltage (V2) which is a negative voltage before the first gate voltage (Vg1) is changed from the turn-on voltage (Von) to the turn-off voltage (Voff).

When the second gate voltage (Vg2) is made a negative voltage, a p-type inversion layer is formed in the drift region 32 in contact with the second gate insulating film 42. Accordingly, the discharge of holes from the drift region 32 to the upper electrode 12 is promoted.

Therefore, the influence of carriers remaining in the drift region 32 on the operation of the diode can be reduced compared to the RC-IGBT 1000 of the comparative example. Therefore, it is not necessary to provide the large boundary region 103, and the size of the boundary region 103 can be reduced. Therefore, the RC-IGBT 100 of the first embodiment can reduce the chip size compared to the RC-IGBT 1000 of the comparative example.

Incidentally, in FIG. 3, the case where the emitter region 36 and the contact region 40 of the IGBT region 101 extend on the first face P1 in the first direction has been described as an example. However, for example, the emitter regions 36 and the contact regions 40 may be alternately disposed between two first gate trenches 21 in the first direction.

Hereinbefore, as described above, according to the first embodiment, it is possible to realize the semiconductor device and the semiconductor circuit in which the chip size can be reduced.

Second Embodiment

In a semiconductor device and a semiconductor circuit of a second embodiment, the semiconductor layer of the third region includes the fifth semiconductor region of a second conductivity type provided between the fourth semiconductor region and the first face, and the second gate insulating film provided in the semiconductor layer of the third region contacts with the fifth semiconductor region. The semiconductor device and the semiconductor circuit of a second embodiment are different from that of the semiconductor device and the semiconductor circuit of the first embodiment in the above-mentioned characteristics. Hereinafter, a part of the description overlapping the first embodiment may be omitted.

The semiconductor device of the second embodiment is an RC-IGBT 200 in which an IGBT and a freewheeling diode are formed on the same semiconductor chip.

Figure 6:
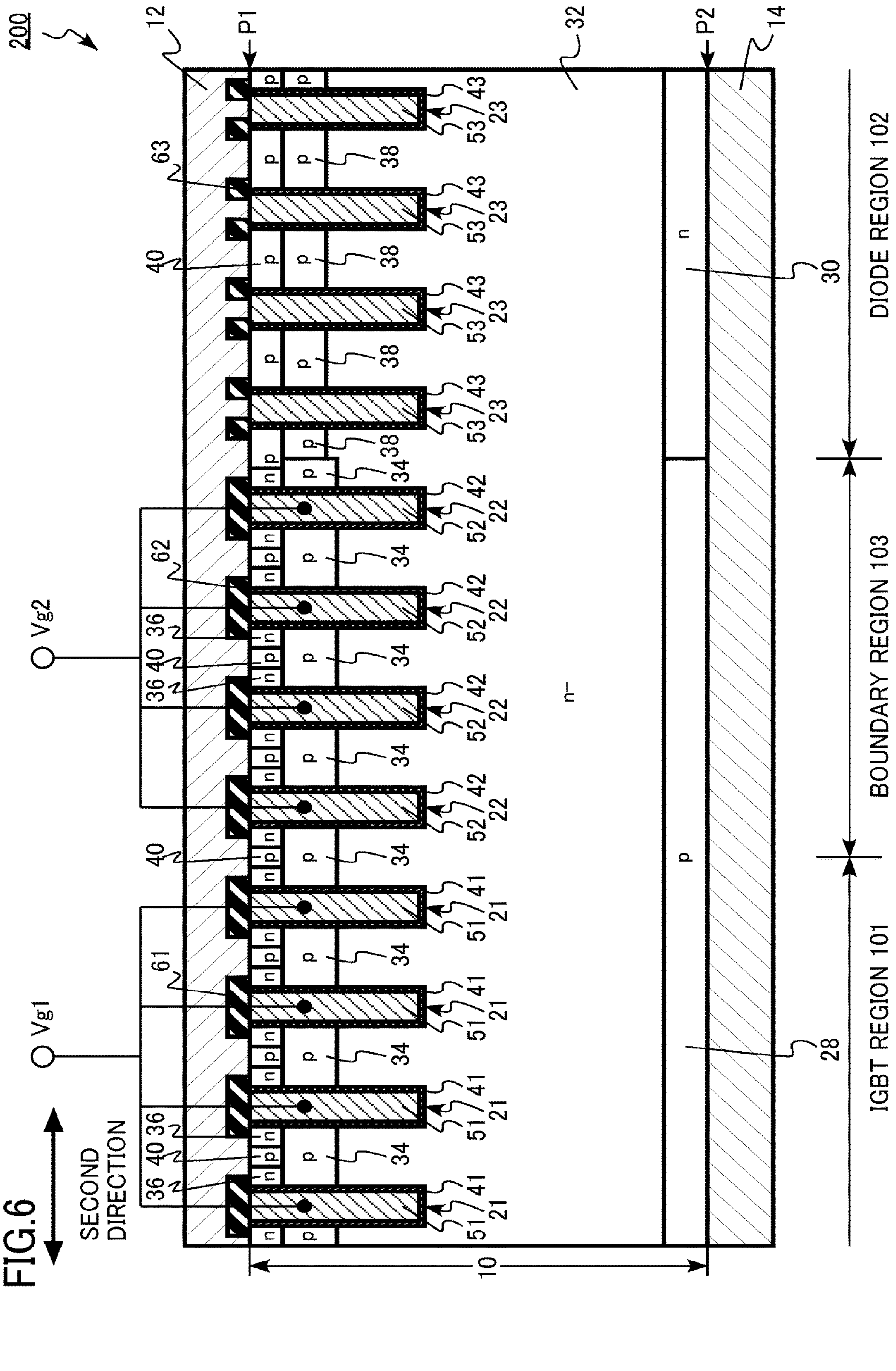
FIG. 6 is a schematic cross-sectional view of a part of a semiconductor device of a second embodiment.

FIG. 6 is a schematic cross-sectional view of a part of the semiconductor device of the second embodiment. FIG. 6 is a cross-sectional view corresponding to FIG. 2 of the first embodiment.

The semiconductor layer 10 in the boundary region 103 has an emitter region 36 provided between the base region 34 and the first face P1. The emitter region 36 is in contact with the second gate insulating film 42 in the boundary region 103.

When the emitter region 36 is provided in the boundary region 103, a transistor including the second gate electrode 52 exists in the boundary region 103. In the on state of the IGBT, when the turn-on voltage (Von) is applied as the first voltage (V1) to the second gate electrode 52, a transistor including the second gate electrode 52 in the boundary region 103 also contribute the flow on the on-state current. Therefore, the on-state current of the RC-IGBT 200 increases.

Incidentally, as in the first embodiment, when the IGBT is in an off state, the discharge of holes from the drift region 32 to the upper electrode 12 is promoted by making the second gate voltage (Vg2) to a negative voltage.

Hereinbefore, as described above, according to the second embodiment, a semiconductor device and a semiconductor circuit capable of reducing the chip size can be realized as in the first embodiment. In addition, a semiconductor device and a semiconductor circuit with increased on-state current can be realized.

Third Embodiment

In a semiconductor device and a semiconductor circuit of a third embodiment, the semiconductor layer of the third region further includes a fourth trench provided in contact with the fourth semiconductor region on the first face side. The semiconductor device and the semiconductor circuit are different from the semiconductor device and the semiconductor circuit of the second embodiment in that the semiconductor device and the semiconductor circuit further include a second conductive layer provided in the fourth trench, the second conductive layer being electrically isolated from the first gate electrode and the second gate electrode and a second insulating film provided between the second conductive layer and the third semiconductor region and between the second conductive layer and the fourth semiconductor region. Hereinafter, a part of the description overlapping the first embodiment or the second embodiment may be omitted.

The semiconductor device of the third embodiment is an RC-IGBT 300 in which an IGBT and a freewheeling diode are formed on the same semiconductor chip.

Figure 7:
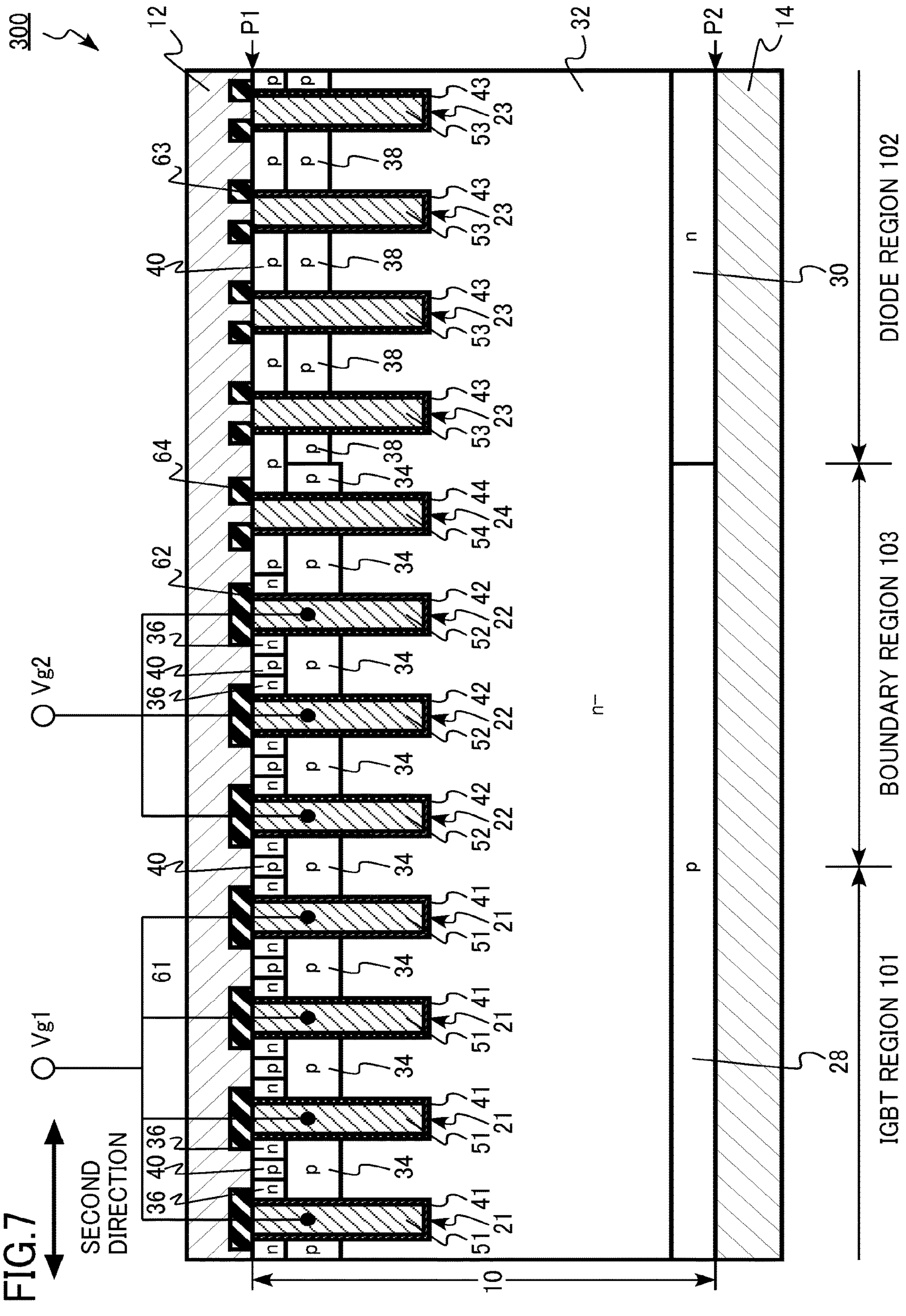
FIG. 7 is a schematic cross-sectional view of a part of a semiconductor device of a third embodiment.

FIG. 7 is a schematic cross-sectional view of a part of the semiconductor device of the third embodiment. FIG. 7 is a cross-sectional view corresponding to FIG. 2 of the first embodiment.

The semiconductor layer 10 in the boundary region 103 includes a dummy trench 24 (fourth trench), a second insulating film 44, a dummy conductive layer 54 (second conductive layer), and a fourth interlayer insulating layer 64.

The dummy trench 24 is provided in the boundary region 103. The dummy trench 24 is provided in contact with the base region 34 on the first face P1 side of the semiconductor layer 10.

The dummy trench 24 is provided at the end of the boundary region 103 on the diode region 102 side. The dummy trench 24 is provided between the second gate trench 22 and the diode trench 23. The dummy trench 24 is adjacent to the diode trench 23.

The dummy trench 24 extends in the first direction parallel to the first face P1 on the first face P1. The dummy trench 24 has a stripe shape.

The dummy trench 24 penetrates the base region 34 and reaches the drift region 32. For example, the depth of the dummy trench 24 is 8 μm or less.

The dummy conductive layer 54 is provided in the dummy trench 24. For example, the dummy conductive layer 54 is a semiconductor or a metal. For example, the dummy conductive layer 54 is amorphous silicon or polycrystalline silicon containing n-type impurities or p-type impurities. The dummy conductive layer 54 is electrically connected to the upper electrode 12.

The second insulating film 44 is provided between the dummy conductive layer 54 and the semiconductor layer 10. The second insulating film 44 is provided between the dummy conductive layer 54 and the drift region 32, between the dummy conductive layer 54 and the base region 34, and between the dummy conductive layer 54 and the contact region 40. The second insulating film 44 is in contact with the drift region 32 and the base region 34. The second insulating film 44 is not in contact with the emitter region 36. The second insulating film 44 is separated from the emitter region 36. For example, the second insulating film 44 is silicon oxide.

The fourth interlayer insulating layer 64 is provided between the dummy conductive layer 54 and the upper electrode 12. An opening is provided in a part of the fourth interlayer insulating layer 64. The upper electrode 12 is in contact with the dummy conductive layer 54 through the opening. The dummy conductive layer 54 and the upper electrode 12 are electrically connected. For example, the fourth interlayer insulating layer 64 is silicon oxide.

The region where the dummy trench 24 exists in the boundary region 103 does not function as a transistor even when the IGBT is in an on state. For this reason, the on-state current of the IGBT does not flow at the end of the boundary region 103 on the diode region 102 side. Therefore, the amount of carriers in the boundary region 103 after the IGBT is turned off decreases. Therefore, for example, as compared with the RC-IGBT 200 of the second embodiment, the size of the boundary region 103 can be reduced, and the chip size can be reduced.

Incidentally, the dummy conductive layer 54 may be in a floating state in which the dummy conductive layer is not fixed to a specific potential. In this case, the fourth interlayer insulating layer 64 is not provided with an opening.

In FIG. 7, a case where the second gate insulating film 42 is in contact with the emitter region 36 is illustrated as an example. However, the second gate insulating film 42 may not be in contact with the emitter region 36.

Hereinbefore, as described above, according to the third embodiment, the semiconductor device and the semiconductor circuit in which the chip size can be reduced can be realized as in the first embodiment. Further, the semiconductor device and the semiconductor circuit in which the on-state current increases can be realized as in the second embodiment.

Fourth Embodiment

In a semiconductor device and a semiconductor circuit of a fourth embodiment, the semiconductor device and the semiconductor circuit are different from the semiconductor device and the semiconductor circuit of the second embodiment in that the second gate insulating film at the end on the second region side provided in the semiconductor layer of the third region is not in contact with the fifth semiconductor region. Hereinafter, a part of the description overlapping the first embodiment or the second embodiment may be omitted.

The semiconductor device of the fourth embodiment is an RC-IGBT 400 in which an IGBT and a freewheeling diode are formed on the same semiconductor chip.

Figure 8:
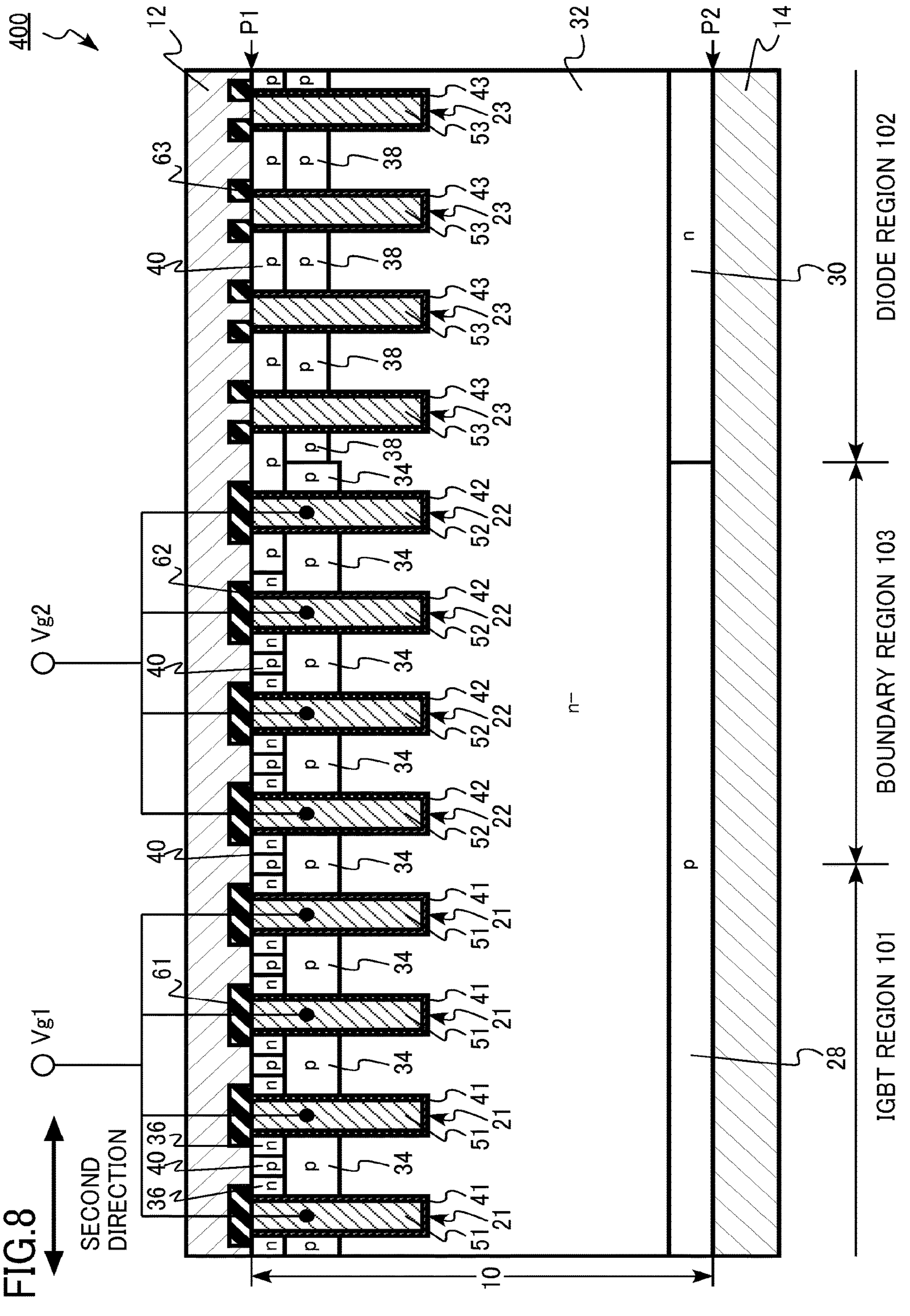
FIG. 8 is a schematic cross-sectional view of a part of a semiconductor device of a fourth embodiment.

FIG. 8 is a schematic cross-sectional view of a part of the semiconductor device of the fourth embodiment. FIG. 8 is a cross-sectional view corresponding to FIG. 2 of the first embodiment.

The second gate insulating film 42 at the end on the diode region 102 side provided on the semiconductor layer 10 in the boundary region 103 is not in contact with the emitter region 36.

Since the second gate insulating film 42 is not in contact with the emitter region 36, the end of the boundary region 103 on the diode region 102 side does not function as a transistor even when the IGBT is in an on state. For this reason, the on-state current of the IGBT does not flow at the end of the boundary region 103 on the diode region 102 side. Therefore, the amount of carriers remaining in the boundary region 103 after the IGBT is turned off decreases. Therefore, for example, as compared with the RC-IGBT 200 of the second embodiment, the size of the boundary region 103 can be reduced, and the chip size can be reduced.

As described above, according to the fourth embodiment, the semiconductor device and the semiconductor circuit in which the chip size can be reduced can be realized as in the first embodiment. Further, the semiconductor device and the semiconductor circuit in which the on-state current increases can be realized as in the second embodiment.

Fifth Embodiment

The semiconductor device and the semiconductor circuit of the fifth embodiment are different from the semiconductor device and the semiconductor circuit of the first embodiment in that the second trench is provided in the semiconductor layer of the first region. Hereinafter, a part of the description overlapping the first embodiment may be omitted.

The semiconductor device of the fifth embodiment is an RC-IGBT 500 in which an IGBT and a freewheeling diode are formed on the same semiconductor chip.

Figure 9:
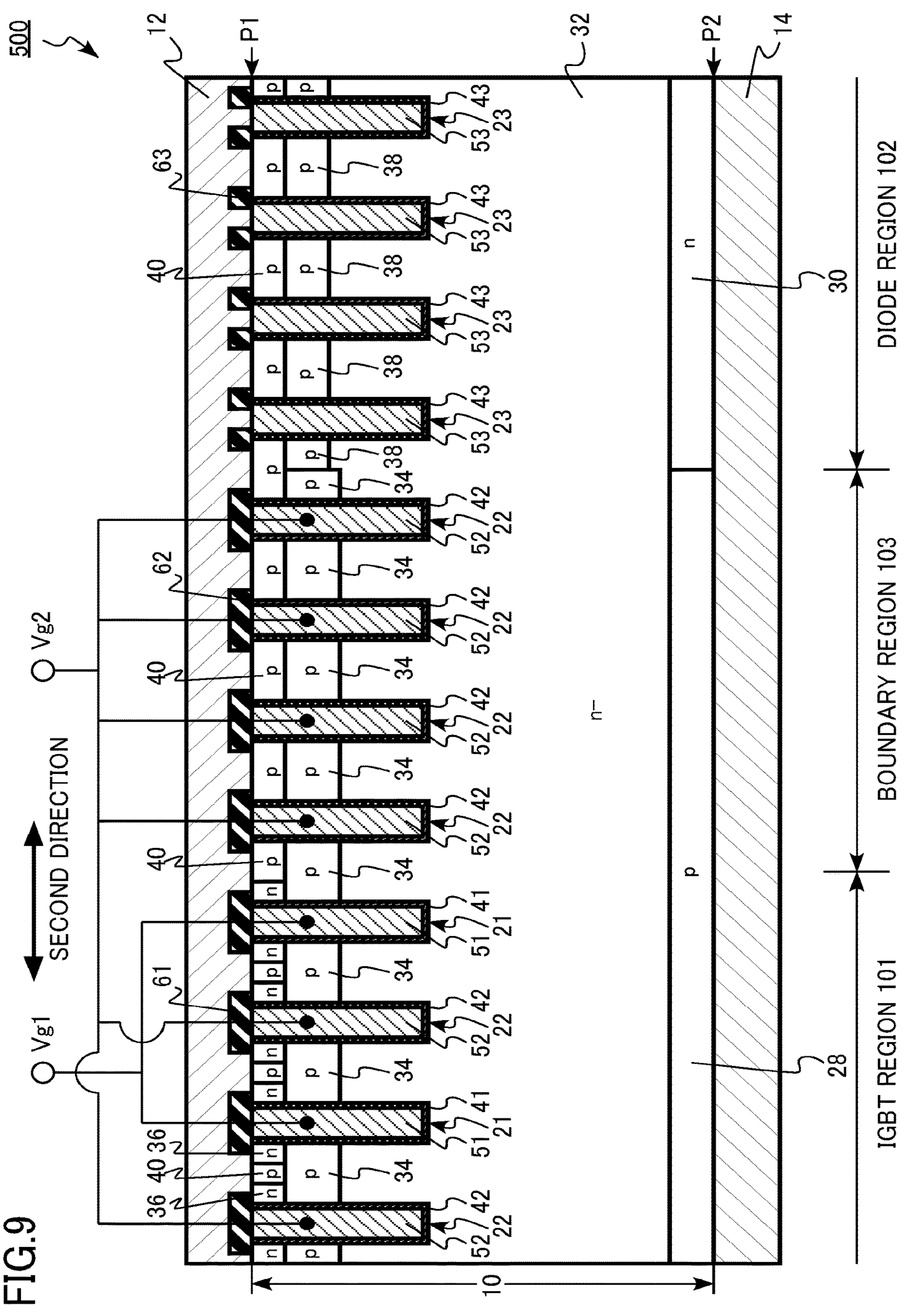
FIG. 9 is a schematic cross-sectional view of a part of a semiconductor device of a fifth embodiment.

FIG. 9 is a schematic cross-sectional view of a part of the semiconductor device of the fifth embodiment. FIG. 9 is a cross-sectional view corresponding to FIG. 2 of the first embodiment.

The semiconductor layer 10 in the IGBT region 101 includes the second gate trench 22 (second trench). The semiconductor layer 10 in the IGBT region 101 is provided with first gate trenches 21 and second gate trenches 22 alternately.

By providing the second gate trench 22 in the IGBT region 101, when the IGBT is turned off, a p-type inversion layer can be formed in the drift region 32 prior to the turning-off of the IGBT. Therefore, the discharge of holes from the drift region 32 is promoted, and the turn-off time can be shortened. Therefore, switching loss can be reduced.

In FIG. 9, a case where the second gate insulating film 42 in the boundary region 103 is not in contact with the emitter region 36 is illustrated as an example. However, the second gate insulating film 42 in the boundary region 103 may be in contact with the emitter region 36.

Further, in FIG. 9, a case where the second gate insulating film 42 in the IGBT region 101 is in contact with the emitter region 36 is illustrated as an example. However, the second gate insulating film 42 in the IGBT region 101 may not be in contact with the emitter region 36.

Hereinbefore, according to the fifth embodiment, the semiconductor device and the semiconductor circuit in which the chip size can be reduced can be realized as in the first embodiment. In addition, the semiconductor device and the semiconductor circuit in which switching loss can be reduced can be realized.

Sixth Embodiment

The semiconductor device and the semiconductor circuit of the sixth embodiment are different from the semiconductor device and the semiconductor circuit of the first embodiment in that the semiconductor layer further includes a seventh semiconductor region of second conductivity type provided between the first semiconductor region and the second semiconductor region, the seventh semiconductor region being in contact with the second face, and the seventh semiconductor region having a second conductivity type impurity concentration lower than that of the second semiconductor region. Hereinafter, a part of the description overlapping the first embodiment may be omitted.

The semiconductor device of the sixth embodiment is an RC-IGBT 600 in which an IGBT and a freewheeling diode are formed on the same semiconductor chip.

Figure 10:
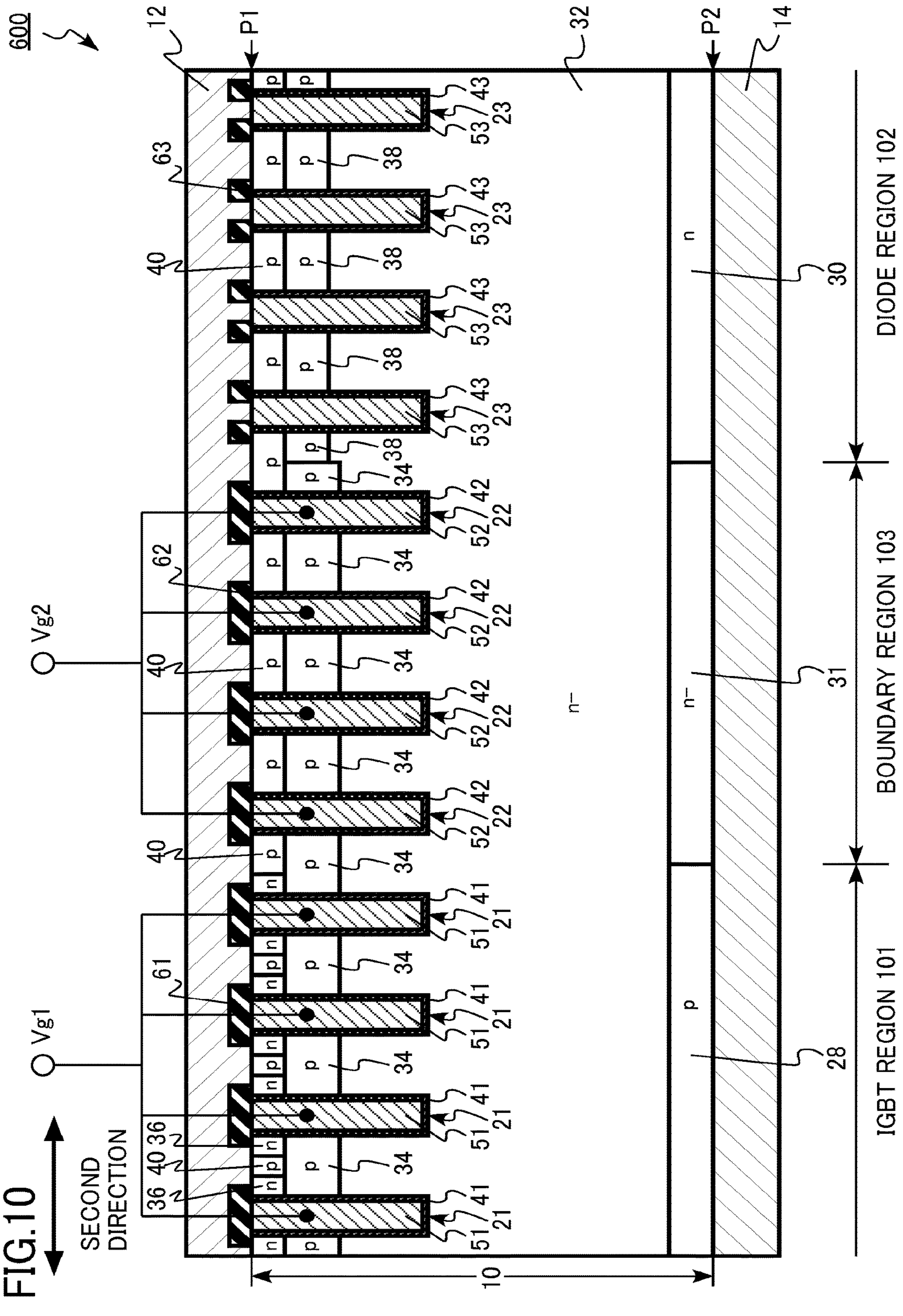
FIG. 10 is a schematic cross-sectional view of a part of a semiconductor device of a sixth embodiment.

FIG. 10 is a schematic cross-sectional view of a part of the semiconductor device of the sixth embodiment. FIG. 10 is a cross-sectional view corresponding to FIG. 2 of the first embodiment.

The semiconductor layer 10 has an n-type region 31 (seventh semiconductor region). The n-type region 31 is provided between the collector region 28 and the cathode region 30. The n-type region 31 is in contact with the second face P2.

The n-type region 31 is an n-type semiconductor region. The n-type impurity concentration in the n-type region 31 is lower than the n-type impurity concentration in the cathode region 30.

By providing the n-type region 31, injection of holes into the drift region 32 when the IGBT is turned on is suppressed. For this reason, in the boundary region 103, the amount of carriers remaining in the drift region 32 when the IGBT is turned off is reduced. Accordingly, the discharge of holes from the drift region 32 to the upper electrode 12 is accelerated.

Therefore, the influence of the carriers remaining in the drift region 32 on the operation of the diode can be reduced. Thus, the size of the boundary region 103 can be reduced, and the chip size can be reduced.

Hereinbefore, according to the sixth embodiment, the semiconductor device and the semiconductor circuit in which the chip size can be further reduced can be realized as compared with the first embodiment.

Seventh Embodiment

The semiconductor device and the semiconductor circuit of the seventh embodiment are different from the semiconductor device and the semiconductor circuit of the first embodiment in that the semiconductor layer further includes an eighth semiconductor region of first conductivity type provided between the first semiconductor region and the second semiconductor region, the eighth semiconductor region being in contact with the second face, and the eighth semiconductor region having a first conductivity type impurity concentration lower than that of the first semiconductor region. Hereinafter, a part of the description overlapping the first embodiment may be omitted.

The semiconductor device of the seventh embodiment is an RC-IGBT 700 in which an IGBT and a freewheeling diode are formed on the same semiconductor chip.

Figure 11:
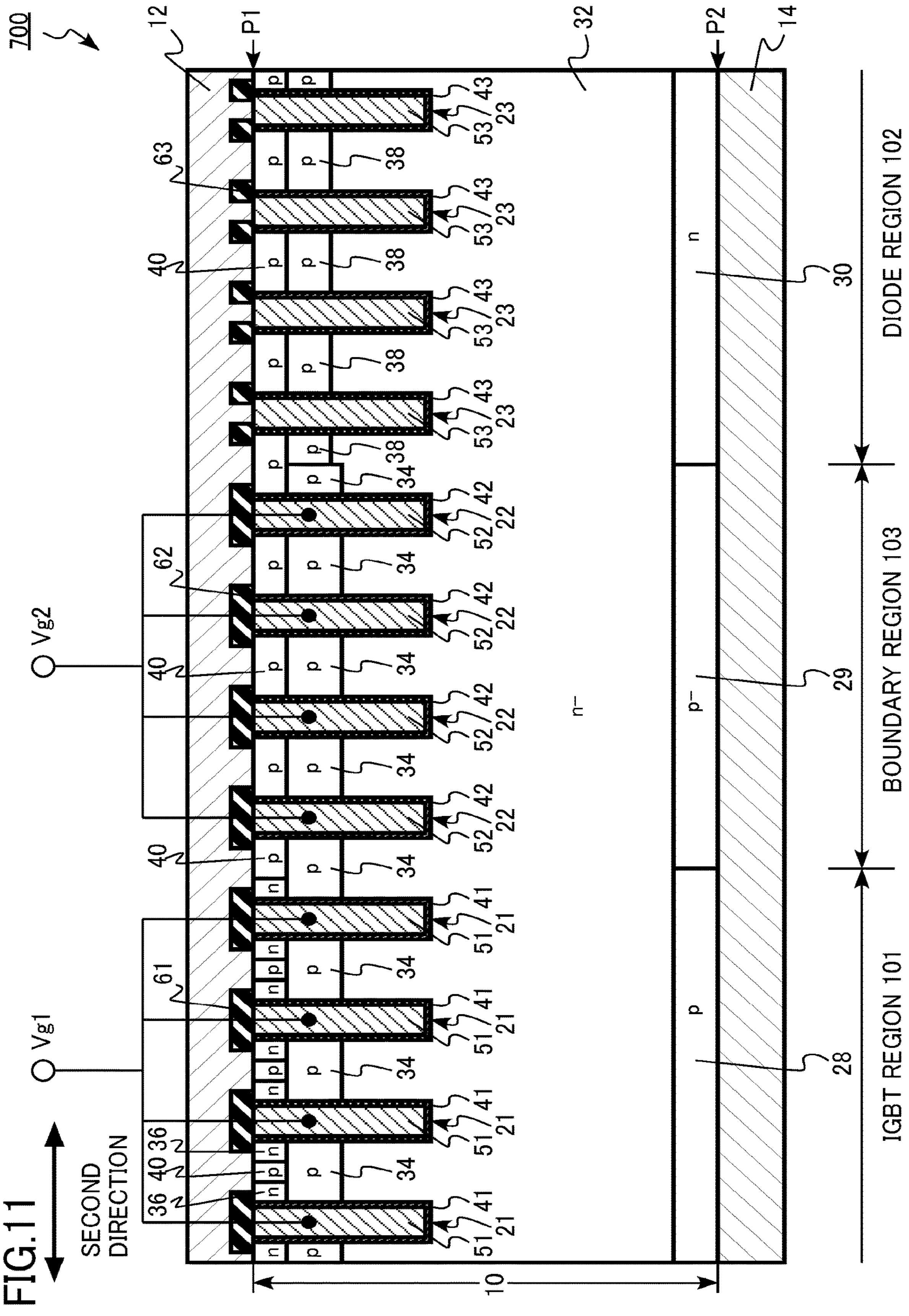
FIG. 11 is a schematic cross-sectional view of a part of a semiconductor device of a seventh embodiment.

FIG. 11 is a schematic cross-sectional view of a part of the semiconductor device of the seventh embodiment. FIG. 11 is a cross-sectional view corresponding to FIG. 2 of the first embodiment.

The semiconductor layer 10 has a p-type region 29 (eighth semiconductor region). The p-type region 29 is provided between the collector region 28 and the cathode region 30. The p-type region 29 is in contact with the second face P2.

The p-type region 29 is a $p^-$-type semiconductor region. The p-type impurity concentration in the p-type region 29 is lower than the p-type impurity concentration in the collector region 28.

By providing the p-type region 29 having a p-type impurity concentration lower than that of the collector region 28, injection of holes into the drift region 32 when the IGBT is turned on is suppressed. For this reason, in the boundary region 103, the amount of carriers remaining in the drift region 32 when the IGBT is turned off is reduced. Accordingly, the discharge of holes from the drift region 32 to the upper electrode 12 is accelerated.

Therefore, the influence of the carriers remaining in the drift region 32 on the operation of the diode can be reduced. Thus, the size of the boundary region 103 can be reduced, and the chip size can be reduced.

Hereinbefore, according to the seventh embodiment, the semiconductor device and the semiconductor circuit in which the chip size can be further reduced can be realized as compared with the first embodiment.

Eighth Embodiment

The semiconductor device and the semiconductor circuit of the eighth embodiment are different from the semiconductor device and the semiconductor circuit of the first embodiment in that the semiconductor device and the semiconductor circuit further include a third electrode pad provided on the first face side of the semiconductor layer, the third electrode pad being electrically connected to the first conductive layer. Hereinafter, a part of the description overlapping the first embodiment may be omitted.

The semiconductor device of the eighth embodiment is an RC-IGBT 800 in which an IGBT and a freewheeling diode are formed on the same semiconductor chip.

Figure 12:
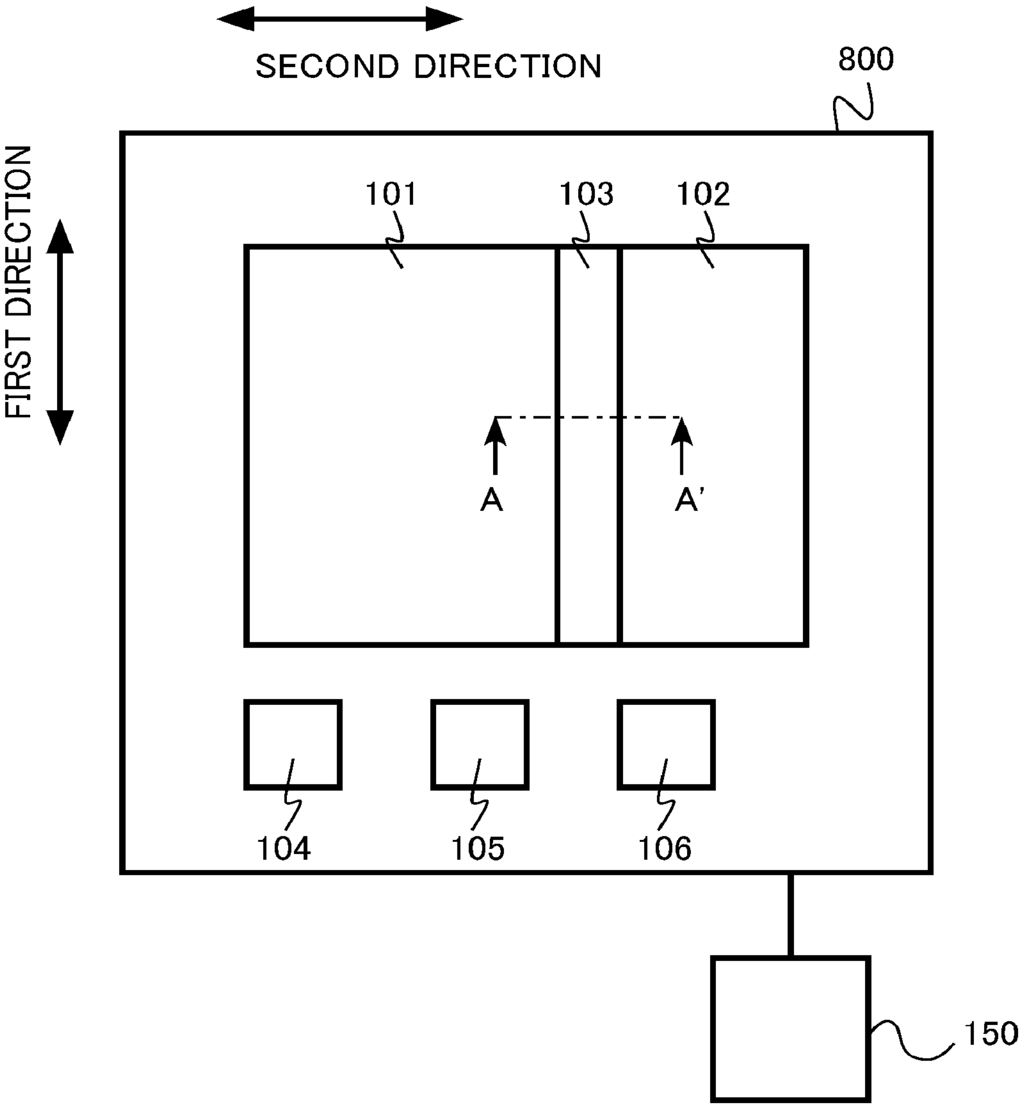
FIG. 12 is a schematic diagram of a semiconductor circuit of an eighth embodiment.
Figure 13:
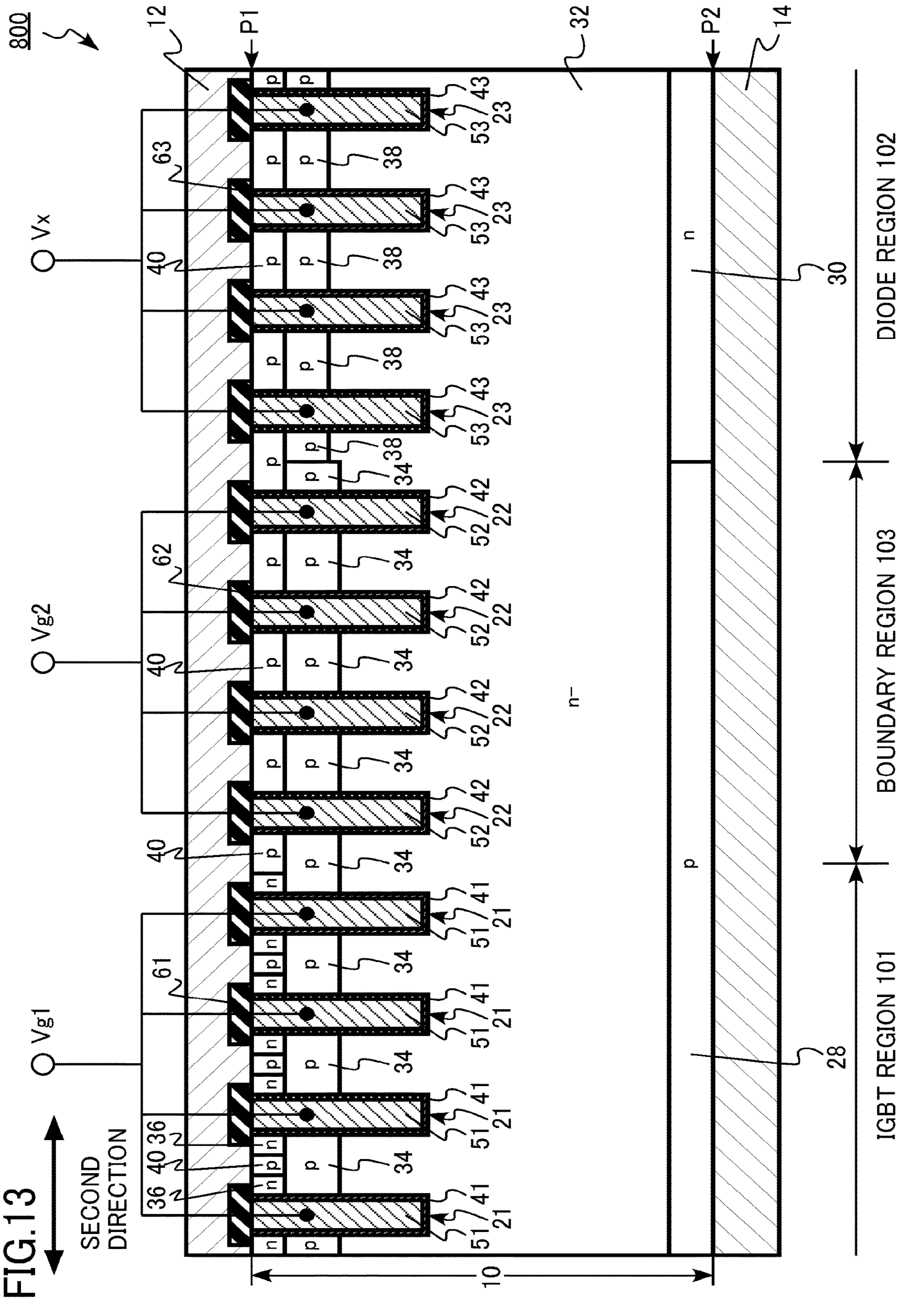
FIG. 13 is a schematic cross-sectional view of a part of the semiconductor device of the eighth embodiment.

FIG. 12 is a schematic diagram of the semiconductor circuit of the eighth embodiment. FIG. 13 is a schematic cross-sectional view of a part of the semiconductor device of the eighth embodiment. FIG. 13 is a cross-sectional view corresponding to FIG. 2 of the first embodiment.

The semiconductor circuit of the eighth embodiment includes an RC-IGBT 800 and a gate driver circuit 150. The RC-IGBT 800 has the IGBT region 101 (first region), the diode region 102 (second region), and the boundary region 103 (third region). The boundary region 103 is provided between the IGBT region 101 and the diode region 102.

The RC-IGBT 800 of the eighth embodiment includes the semiconductor layer 10, the upper electrode 12 (first electrode), the lower electrode 14 (second electrode), the first gate insulating film 41, the second gate insulating film 42, the first insulating film 43, the first gate electrode 51, the second gate electrode 52, the diode conductive layer 53 (first conductive layer), the first interlayer insulating layer 61, the second interlayer insulating layer 62, the third interlayer insulating layer 63, the first gate electrode pad 104 (first electrode pad), the second gate electrode pad 105 (second electrode pad), and a diode electrode pad 106 (third electrode pad).

The diode electrode pad 106 is provided on the first face P1 side of the semiconductor layer 10. The diode electrode pad 106 is electrically connected to the diode conductive layer 53. The diode electrode pad 106 and the diode conductive layer 53 are connected by, for example, a metal wiring (not illustrated). A voltage (Vx) is applied to the diode electrode pad 106.

For example, carriers remain in the drift region 32 of the diode region 102 when the diode of the diode region 102 shifts from the on state to the off state. If the discharge of the remaining carriers is delayed, the operation of the IGBT in the IGBT region 101 is affected, and the operation of the RC-IGBT may become unstable.

The RC-IGBT 800 of the eighth embodiment includes a diode electrode pad 106 that is electrically connected to the diode conductive layer 53. Therefore, a voltage can be applied to the diode conductive layer 53 independently of the first gate electrode 51 and the second gate electrode 52. That is, a voltage different from that of the first gate electrode 51 and the second gate electrode 52 can be applied to the diode conductive layer 53 at different timings.

For example, when the diode in the diode region 102 shifts from the on state to the off state, when a negative voltage is applied to the diode electrode pad 106, a p-type inversion layer is formed in the drift region 32 in contact with the first insulating film 43. Accordingly, the discharge of holes from the drift region 32 to the upper electrode 12 is promoted.

Therefore, the influence of carriers remaining in the drift region 32 on the operation of the IGBT can be reduced compared to the RC-IGBT 100 of the first embodiment.

Hereinbefore, according to the eighth embodiment, the semiconductor device and the semiconductor circuit in which the chip size can be reduced can be realized as in the first embodiment. In addition, it is possible to reduce the influence of the operation of the diode on the operation of the IGBT.

Ninth Embodiment

The semiconductor device and the semiconductor circuit of the ninth embodiment are different from the semiconductor device and the semiconductor circuit of the first embodiment in that the semiconductor layer in the second region does not include the third trench. Hereinafter, a part of the description overlapping the first embodiment may be omitted.

The semiconductor device of the ninth embodiment is an RC-IGBT900 in which an IGBT and a freewheeling diode are formed on the same semiconductor chip.

Figure 14:
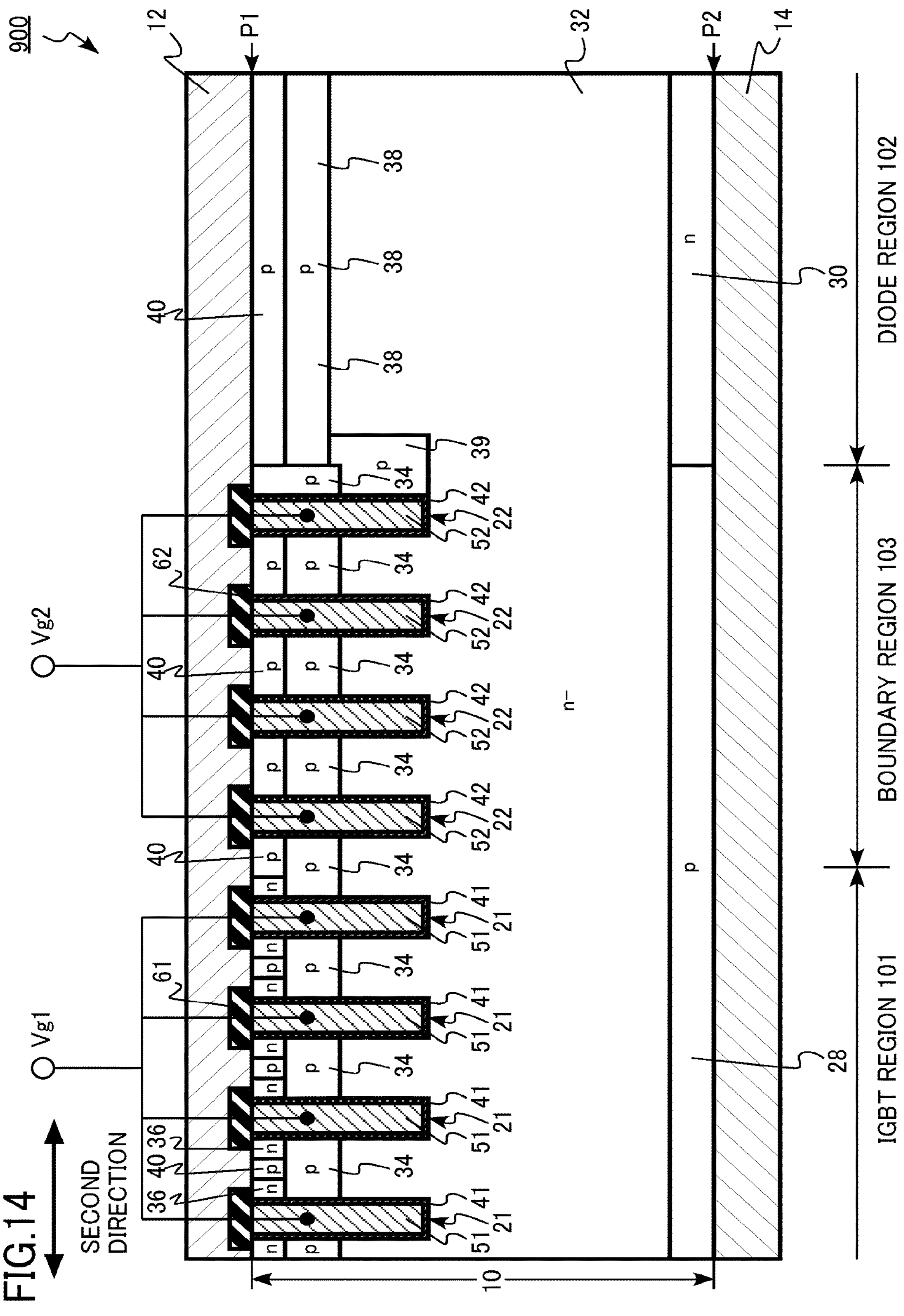
FIG. 14 is a schematic cross-sectional view of a part of a semiconductor device of a ninth embodiment.

FIG. 14 is a schematic cross-sectional view of a part of the semiconductor device of the ninth embodiment. FIG. 14 is a cross-sectional view corresponding to FIG. 2 of the first embodiment.

The RC-IGBT 900 of the ninth embodiment does not include the diode trench 23 in the semiconductor layer 10 of the diode region 102. In addition, the semiconductor layer 10 includes an electric field relaxation region 39 (ninth semiconductor region).

The electric field relaxation region 39 is a p-type semiconductor region. The electric field relaxation region 39 is provided between the second gate trench 22 and the drift region 32 at the end of the boundary region 103.

The electric field relaxation region 39 is deeper than the base region 34 and the anode region 38. The electric field relaxation region 39 has a function of relaxing the electric field concentration near the second gate trench 22 at the end of the boundary region 103 and improving the breakdown voltage of the RC-IGBT 900.

Hereinbefore, according to the ninth embodiment, the semiconductor device and the semiconductor circuit in which the chip size can be reduced can be realized as in the first embodiment.

In the first to ninth embodiments, a case where the semiconductor layer is single crystal silicon is described as an example. However, the semiconductor layer is not limited to single crystal silicon. For example, other single crystal semiconductors such as single crystal silicon carbide may be used.

In the first to ninth embodiments, the case of the stripe shape in which the trenches are disposed in parallel is described as an example. However, the present disclosure can also be applied to a mesh-shaped trench or a dot-shaped trench where the trenches intersect.

In the first to ninth embodiments, a case where the first conductivity type is p-type, and the second conductivity type is n-type is described as an example. However, the first conductivity type may be n-type, and the second conductivity type may be p-type. When the first conductivity type is n-type, and the second conductivity type is p-type, for example, the second voltage (V2) is a positive voltage.

In the first to ninth embodiments, a case where the first gate trench 21 is not provided in the boundary region 103 is described as an example. However, as long as the density of the second gate trench 22 in the boundary region 103 is higher than the density of the second gate trench 22 in the IGBT region 101, the configuration also can be made such that the first gate trench 21 is provided in the boundary region 103.

While certain embodiments have been described, these embodiments have been presented by way of example only, and are not intended to limit the scope of the inventions. Indeed, the semiconductor device and the semiconductor circuit described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:

a semiconductor layer having a first face and a second face facing the first face, the semiconductor layer including a first semiconductor region of first conductivity type in contact with the second face, a second semiconductor region of second conductivity type in contact with the second face, a third semiconductor region of second conductivity type provided between the first semiconductor region and the first face and between the second semiconductor region and the first face, a fourth semiconductor region of first conductivity type provided between the first semiconductor region and the first face, the third semiconductor region being interposed between the fourth semiconductor region and the first semiconductor region, a fifth semiconductor region of second conductivity type provided between the fourth semiconductor region and the first face, a sixth semiconductor region of first conductivity type provided between the second semiconductor region and the first face, the third semiconductor region being interposed between the sixth semiconductor region and the second semiconductor region, a first trench provided on the first face side in contact with the fourth semiconductor region, and a second trench provided on the first face side in contact with the fourth semiconductor region;

a first gate electrode provided in the first trench;

a first gate insulating film provided between the first gate electrode and the third semiconductor region and between the first gate electrode and the fourth semiconductor region, the first gate insulating film being in contact with the fifth semiconductor region;

a second gate electrode provided in the second trench;

a second gate insulating film provided between the second gate electrode and the third semiconductor region and between the second gate electrode and the fourth semiconductor region;

a first electrode provided on the first face side of the semiconductor layer, the first electrode being electrically connected to the fourth semiconductor region, the fifth semiconductor region, and the sixth semiconductor region;

a second electrode provided on the second face side of the semiconductor layer, the second electrode being electrically connected to the first semiconductor region and the second semiconductor region;

a first electrode pad provided on the first face side of the semiconductor layer, the first electrode pad being electrically connected to the first gate electrode, and the first electrode pad being applied with a first gate voltage;

a second electrode pad provided on the first face side of the semiconductor layer, the second electrode pad being electrically connected to the second gate electrode, and the second electrode pad being applied with a second gate voltage;

a first region including the first semiconductor region;

a second region including the second semiconductor region; and a third region provided between the first region and the second region, the third region having a density of the second trench higher than that of the first region.

2. The semiconductor device according to claim 1, wherein the semiconductor layer of the second region further includes a third trench provided in contact with the sixth semiconductor region on the first face side, the semiconductor device further comprising:

a first conductive layer provided in the third trench; and a first insulating film provided between the first conductive layer and the third semiconductor region and between the first conductive layer and the sixth semiconductor region.

3. The semiconductor device according to claim 2, wherein the first conductive layer is electrically connected to the first electrode.

4. The semiconductor device according to claim 2, further comprising:

a third electrode pad provided on the first face side of the semiconductor layer, the third electrode pad being electrically connected to the first conductive layer.

5. The semiconductor device according to claim 1, wherein the second gate insulating film provided in the semiconductor layer in the third region is not in contact with the fifth semiconductor region.

6. The semiconductor device according to claim 1, wherein the second gate insulating film provided in the third region is in contact with the fifth semiconductor region.

7. The semiconductor device according to claim 1, wherein the semiconductor layer of the third region further includes a fourth trench provided in contact with the fourth semiconductor region on the first face side, the semiconductor device further comprising:

a second conductive layer provided in the fourth trench, the second conductive layer being electrically isolated from the first gate electrode and the second gate electrode; and a second insulating film provided between the second conductive layer and the third semiconductor region and between the second conductive layer and the fourth semiconductor region.

8. The semiconductor device according to claim 7, wherein the second conductive layer is electrically connected to the first electrode.

9. The semiconductor device according to claim 1, wherein the second trench is provided in the semiconductor layer of the first region.

10. The semiconductor device according to claim 1, wherein the semiconductor layer further includes a seventh semiconductor region of second conductivity type provided between the first semiconductor region and the second semiconductor region, the seventh semiconductor region being in contact with the second face, and the seventh semiconductor region having a second conductivity type impurity concentration lower than that of the second semiconductor region.

11. The semiconductor device according to claim 1, wherein the semiconductor layer further includes an eighth semiconductor region of first conductivity type provided between the first semiconductor region and the second semiconductor region, the eighth semiconductor region being in contact with the second face, and the eighth semiconductor region having a first conductivity type impurity concentration lower than that of the first semiconductor region.

12. The semiconductor device according to claim 1, wherein the semiconductor layer further includes a ninth semiconductor region provided between the second trench closest to the sixth semiconductor region and the third semiconductor region, the ninth semiconductor region being deeper than the fourth semiconductor region and the sixth semiconductor region.

13. The semiconductor device according to claim 1, wherein the second gate voltage is changed from a first voltage to a second voltage before the first gate voltage is changed from a turn-on voltage to a turn-off voltage, the second voltage is a negative voltage when a first conductivity type is p-type, and the second voltage is a positive voltage when the first conductivity type is n-type.

14. A semiconductor circuit comprising:

the semiconductor device according to claim 1; and a control circuit configured to drive the semiconductor device and change the second gate voltage from a first voltage to a second voltage before changing the first gate voltage from a turn-on voltage to a turn-off voltage, such that the second voltage is a negative voltage when a first conductivity type is p-type, and the second voltage is a positive voltage when the first conductivity type is n-type.

* * * * *